(12) United States Patent
Hochleitner et al.

(10) Patent No.: US 11,099,482 B2
(45) Date of Patent: Aug. 24, 2021

(54) ADAPTING THE DURATION OF EXPOSURE SLOTS IN MULTI-BEAM WRITERS

(71) Applicant: IMS Nanofabrication GmbH, Vienna (AT)

(72) Inventors: Gottfried Hochleitner, Vienna (AT); Christoph Spengler, Vienna (AT); Wolf Naetar, Vienna (AT)

(73) Assignee: IMS Nanofabrication GmbH, Vienna (AT)

( * ) Notice: Subject to any disclaimer, the term of this patent is extended or adjusted under 35 U.S.C. 154(b) by 0 days.

(21) Appl. No.: 16/865,135

(22) Filed: May 1, 2020

(65) Prior Publication Data

US 2020/0348597 A1 Nov. 5, 2020

Related U.S. Application Data

(60) Provisional application No. 62/843,828, filed on May 6, 2019.

(30) Foreign Application Priority Data

May 3, 2019 (EP) .................................... 19172550

(51) Int. Cl.
  *H01J 37/317* (2006.01)
  *H01J 37/302* (2006.01)
  *G03F 7/213* (2006.01)

(52) U.S. Cl.
  CPC .......... *G03F 7/213* (2013.01); *H01J 37/3026* (2013.01); *H01J 37/3175* (2013.01);
(Continued)

(58) Field of Classification Search
  CPC ..... G03F 7/213; H01J 37/045; H01J 37/3023; H01J 37/3026; H01J 37/3174;
(Continued)

(56) References Cited

U.S. PATENT DOCUMENTS 1,033,741 A 7/1912 Sims
1,420,104 A 6/1922 Howe et al.
(Continued)

FOREIGN PATENT DOCUMENTS

CN 202204836 U 4/2012
EP 0178156 A2 4/1986
(Continued)

OTHER PUBLICATIONS

European Search Report for Application 15159617.8, report dated Oct. 19, 2015, 3 pgs.
(Continued)

*Primary Examiner* — David E Smith
(74) *Attorney, Agent, or Firm* — KPPB LLP

(57) ABSTRACT

In a charged-particle lithography apparatus, during writing a desired pattern, the duration of exposure slots is adapted to compensate for fluctuations of the particle beam. In the writing process the aperture images are mutually overlapping on the target so each pixel is exposed through a number of aperture images overlapping at the respective pixel, which results in an exposure of the respective pixel through an effective pixel exposure time, i.e., the sum of durations of contributing exposure slots, and the exposure slot durations are adjusted by:

(i) determining a desired duration of the effective pixel exposure time for the pixels, as a function of the time of exposure of the pixels,
(ii) determining contributing exposure slots for the pixels,
(iii) calculating durations for the contributing exposure slots thus determined such that the sum of the durations over said contributing exposure slots is an actual effective exposure time which approximates said desired duration of the effective pixel exposure time.

The durations in step (iii) are calculated in accordance with a predetermined set of allowed durations, wherein at least (Continued)

one of the durations thus calculated is different from the other durations selected for said set of exposure slots.

15 Claims, 13 Drawing Sheets

(52) U.S. Cl.
CPC ............... *H01J 2237/31761* (2013.01); *H01J 2237/31776* (2013.01)

(58) Field of Classification Search
CPC ......... H01J 37/3175; H01J 2237/31761; H01J 2237/31764; H01J 2237/31776
See application file for complete search history.

(56) References Cited

U.S. PATENT DOCUMENTS

| | | | |
|---|---|---|---|
| 1,903,005 A | 3/1933 | McCuen |
| 2,187,427 A | 1/1940 | Middleton |
| 2,820,109 A | 1/1958 | Dewitz |
| 2,920,104 A | 1/1960 | Brooks et al. |
| 3,949,265 A | 4/1976 | Holl |
| 4,467,211 A | 8/1984 | Smith |
| 4,735,881 A | 4/1988 | Kobayashi et al. |
| 4,899,060 A | 2/1990 | Lischke |
| 5,103,101 A | 4/1992 | Berglund et al. |
| 5,189,306 A | 2/1993 | Frei |
| 5,260,579 A | 11/1993 | Yasuda et al. |
| 5,369,282 A | 11/1994 | Arai et al. |
| 5,393,987 A | 2/1995 | Abboud et al. |
| 5,399,872 A | 3/1995 | Yasuda et al. |
| 5,533,170 A | 7/1996 | Teitzel et al. |
| 5,814,423 A | 9/1998 | Maruyama et al. |
| 5,841,145 A | 11/1998 | Satoh et al. |
| 5,847,959 A | 12/1998 | Veneklasen et al. |
| 5,857,815 A | 1/1999 | Bailey et al. |
| 5,866,300 A | 2/1999 | Satoh et al. |
| 5,876,902 A | 3/1999 | Veneklasen |
| 5,933,211 A | 8/1999 | Nakasugi et al. |
| 6,014,200 A | 1/2000 | Sogard et al. |
| 6,043,496 A | 3/2000 | Tennant |
| 6,049,085 A | 4/2000 | Ema |
| 6,107,636 A | 8/2000 | Muraki |
| 6,111,932 A | 8/2000 | Dinsmore |
| 6,137,113 A | 10/2000 | Muraki |
| 6,225,637 B1 | 5/2001 | Terashima et al. |
| 6,229,595 B1 | 5/2001 | McKinley |
| 6,252,339 B1 | 6/2001 | Kendall |
| 6,258,511 B1 | 7/2001 | Okino et al. |
| 6,280,798 B1 | 8/2001 | Ring et al. |
| 6,333,138 B1 | 12/2001 | Higashikawa et al. |
| 6,472,673 B1 | 10/2002 | Chalupka et al. |
| 6,473,237 B2 | 10/2002 | Mei |
| 6,552,353 B1 | 4/2003 | Muraki et al. |
| 6,617,587 B2 | 9/2003 | Parker |
| 6,768,123 B2 | 7/2004 | Giering |
| 6,768,125 B2 | 7/2004 | Platzgummer et al. |
| 6,829,054 B2 | 12/2004 | Stanke et al. |
| 6,835,937 B1 | 12/2004 | Muraki et al. |
| 6,858,118 B2 | 2/2005 | Platzgummer et al. |
| 6,897,454 B2 | 5/2005 | Sasaki et al. |
| 6,965,153 B1 | 11/2005 | Ono et al. |
| 7,084,411 B2 | 8/2006 | Lammer-Pachlinger et al. |
| 7,124,660 B2 | 10/2006 | Chiang |
| 7,129,024 B2 | 10/2006 | Ki |
| 7,199,373 B2 | 4/2007 | Stengl et al. |
| 7,201,213 B2 | 4/2007 | Leeson |
| 7,214,951 B2 | 5/2007 | Stengl et al. |
| 7,276,714 B2 | 10/2007 | Platzgummer et al. |
| 7,367,738 B2 | 5/2008 | Cleveland |
| 7,368,738 B2 | 5/2008 | Platzgummer et al. |
| 7,446,601 B2 | 11/2008 | LeChevalier |
| 7,459,247 B2 | 12/2008 | Bijnen et al. |
| 7,671,687 B2 | 3/2010 | LeChevalier |
| 7,683,551 B2 | 3/2010 | Miyamoto et al. |
| 7,687,783 B2 | 3/2010 | Platzgummer et al. |
| 7,710,634 B2 | 5/2010 | Sandstrom |
| 7,714,298 B2 | 5/2010 | Platzgummer et al. |
| 7,741,620 B2 | 6/2010 | Doering et al. |
| 7,772,574 B2 | 8/2010 | Stengl et al. |
| 7,777,201 B2 | 8/2010 | Fragner et al. |
| 7,781,748 B2 | 8/2010 | Platzgummer et al. |
| 7,823,081 B2 | 10/2010 | Sato et al. |
| 8,057,972 B2 | 11/2011 | Heinrich et al. |
| 8,115,183 B2 | 2/2012 | Platzgummer et al. |
| 8,178,856 B2 | 5/2012 | Nakayamada et al. |
| 8,183,543 B2 | 5/2012 | Platzgummer et al. |
| 8,198,601 B2 | 6/2012 | Platzgummer et al. |
| 8,222,621 B2 | 7/2012 | Fragner et al. |
| 8,227,768 B2 | 7/2012 | Smick et al. |
| 8,257,888 B2 | 9/2012 | Sczyrba et al. |
| 8,258,488 B2 | 9/2012 | Platzgummer et al. |
| 8,294,117 B2 | 10/2012 | Kruit et al. |
| 8,304,749 B2 | 11/2012 | Platzgummer et al. |
| 8,378,320 B2 | 2/2013 | Platzgummer |
| 8,502,174 B2 | 8/2013 | Wieland |
| 8,531,648 B2 | 9/2013 | Jager et al. |
| 8,546,767 B2 | 10/2013 | Platzgummer et al. |
| 8,563,942 B2 | 10/2013 | Platzgummer |
| 8,598,544 B2 | 12/2013 | Van De Peut et al. |
| 8,736,170 B1 | 5/2014 | Liu et al. |
| 8,859,983 B2 | 10/2014 | Wieland |
| 9,053,906 B2 | 6/2015 | Platzgummer |
| 9,093,201 B2 | 7/2015 | Platzgummer et al. |
| 9,099,277 B2 | 8/2015 | Platzgummer |
| 9,184,026 B2 | 11/2015 | Wieland |
| 9,188,874 B1 | 11/2015 | Johnson |
| 9,269,543 B2 | 2/2016 | Reiter et al. |
| 9,335,638 B2 | 5/2016 | Jager et al. |
| 9,373,482 B2 | 6/2016 | Platzgummer |
| 9,443,699 B2 | 9/2016 | Platzgummer et al. |
| 9,495,499 B2 | 11/2016 | Platzgummer et al. |
| 9,520,268 B2 | 12/2016 | Platzgummer |
| 9,568,907 B2 | 2/2017 | Platzgummer et al. |
| 9,653,263 B2 | 5/2017 | Platzgummer et al. |
| 9,691,589 B2 | 6/2017 | Van De Peut et al. |
| 9,799,487 B2 | 10/2017 | Platzgummer |
| 9,978,562 B2 | 5/2018 | Van De Peut et al. |
| 10,134,565 B2 * | 11/2018 | Matsumoto ............... G03F 1/78 |
| 10,325,756 B2 | 6/2019 | Platzgummer |
| 10,325,757 B2 | 6/2019 | Platzgummer et al. |
| 10,410,831 B2 | 9/2019 | Platzgummer |
| 10,522,329 B2 | 12/2019 | Platzgummer et al. |
| 10,651,010 B2 | 5/2020 | Platzgummer et al. |
| 10,840,054 B2 | 11/2020 | Platzgummer et al. |
| 2001/0028038 A1 | 10/2001 | Hamaguchi et al. |
| 2002/0021426 A1 | 2/2002 | Mei et al. |
| 2002/0036264 A1 | 3/2002 | Nakasuji et al. |
| 2002/0148978 A1 | 10/2002 | Innes et al. |
| 2003/0085360 A1 | 5/2003 | Parker et al. |
| 2003/0106230 A1 | 6/2003 | Hennessey |
| 2003/0155534 A1 | 8/2003 | Platzgummer et al. |
| 2003/0160980 A1 | 8/2003 | Olsson et al. |
| 2004/0056207 A1 | 3/2004 | Petrov et al. |
| 2004/0058536 A1 | 3/2004 | Ki |
| 2004/0119021 A1 | 6/2004 | Parker et al. |
| 2004/0157407 A1 | 8/2004 | Qin-Yi et al. |
| 2004/0169147 A1 | 9/2004 | Ono et al. |
| 2005/0001178 A1 | 1/2005 | Parker et al. |
| 2005/0063510 A1 | 3/2005 | Hieronimi et al. |
| 2005/0072941 A1 | 4/2005 | Tanimoto et al. |
| 2005/0104013 A1 | 5/2005 | Stengl et al. |
| 2005/0242302 A1 | 11/2005 | Platzgummer et al. |
| 2005/0242303 A1 | 11/2005 | Platzgummer |
| 2006/0060775 A1 | 3/2006 | Sakakibara et al. |
| 2006/0076509 A1 | 4/2006 | Okino et al. |
| 2006/0169925 A1 | 8/2006 | Miyajima et al. |
| 2007/0138374 A1 | 6/2007 | Nishibashi et al. |
| 2007/0178407 A1 | 8/2007 | Hatakeyama et al. |
| 2007/0279768 A1 | 12/2007 | Shibazaki et al. |
| 2008/0024745 A1 | 1/2008 | Baselmans et al. |
| 2008/0080782 A1 | 4/2008 | Olsson et al. |
| 2008/0099693 A1 | 5/2008 | Platzgummer et al. |

(56) References Cited

U.S. PATENT DOCUMENTS

| | | |
|---|---|---|
| 2008/0105827 A1 | 5/2008 | Tamamushi |
| 2008/0128638 A1 | 6/2008 | Doering et al. |
| 2008/0142728 A1 | 6/2008 | Smick et al. |
| 2008/0198352 A1 | 8/2008 | Kugler et al. |
| 2008/0203317 A1 | 8/2008 | Platzgummer et al. |
| 2008/0212052 A1 | 9/2008 | Wagner et al. |
| 2008/0237460 A1 | 10/2008 | Fragner et al. |
| 2008/0257096 A1 | 10/2008 | Zhu et al. |
| 2008/0260283 A1 | 10/2008 | Ivansen |
| 2008/0283767 A1 | 11/2008 | Platzgummer |
| 2008/0299490 A1 | 12/2008 | Takekoshi |
| 2009/0032700 A1 | 2/2009 | Park et al. |
| 2009/0101816 A1 | 4/2009 | Noji et al. |
| 2009/0168043 A1 | 7/2009 | Lee |
| 2009/0200495 A1 | 8/2009 | Platzgummer et al. |
| 2009/0249266 A1 | 10/2009 | Pierrat et al. |
| 2009/0256075 A1 | 10/2009 | Kemen et al. |
| 2009/0321631 A1 | 12/2009 | Smick et al. |
| 2010/0124722 A1 | 5/2010 | Fragner et al. |
| 2010/0127185 A1 | 5/2010 | Fragner et al. |
| 2010/0127431 A1 | 5/2010 | Sandstrom |
| 2010/0178602 A1 | 7/2010 | Seto et al. |
| 2010/0187434 A1 | 7/2010 | Platzgummer et al. |
| 2010/0288938 A1 | 11/2010 | Platzgummer |
| 2011/0053087 A1 | 3/2011 | Nielsen et al. |
| 2011/0073782 A1 | 3/2011 | Wieland |
| 2011/0084219 A1 | 4/2011 | Adamec et al. |
| 2011/0121208 A1 | 5/2011 | Nakayamada et al. |
| 2011/0204253 A1 | 8/2011 | Platzgummer et al. |
| 2011/0226968 A1 | 9/2011 | Platzgummer |
| 2012/0001097 A1 | 1/2012 | Yashima et al. |
| 2012/0007002 A1 | 1/2012 | Nakayamada et al. |
| 2012/0076269 A1 | 3/2012 | Roberts et al. |
| 2012/0085940 A1 | 4/2012 | Matsumoto |
| 2012/0151428 A1 | 6/2012 | Tanaka et al. |
| 2012/0211674 A1 | 8/2012 | Kato |
| 2012/0286169 A1 | 11/2012 | Van de Peut et al. |
| 2012/0286170 A1 | 11/2012 | Van de Peut et al. |
| 2012/0288787 A1 | 11/2012 | Choi et al. |
| 2012/0329289 A1 | 12/2012 | Fujimura et al. |
| 2013/0070222 A1 | 3/2013 | Fujimura |
| 2013/0120724 A1 | 5/2013 | Wieland et al. |
| 2013/0128247 A1 | 5/2013 | Khuat Duy et al. |
| 2013/0157198 A1 | 6/2013 | Yoshikawa et al. |
| 2013/0161511 A1 | 6/2013 | Karimata et al. |
| 2013/0164684 A1 | 6/2013 | Yamanaka |
| 2013/0198697 A1 | 8/2013 | Hotzel et al. |
| 2013/0201468 A1 | 8/2013 | Manakli |
| 2013/0252145 A1 | 9/2013 | Matsumoto et al. |
| 2013/0253688 A1 | 9/2013 | Matsumoto et al. |
| 2014/0042334 A1 | 2/2014 | Wieland |
| 2014/0158916 A1 | 6/2014 | Fujimura |
| 2014/0197327 A1 | 7/2014 | Platzgummer |
| 2014/0240732 A1 | 8/2014 | Tinnemans et al. |
| 2014/0264066 A1 | 9/2014 | Van De Peut et al. |
| 2014/0264086 A1 | 9/2014 | Van De Peut et al. |
| 2014/0322927 A1 | 10/2014 | Morita |
| 2014/0346369 A1 | 11/2014 | Matsumoto |
| 2015/0021493 A1 | 1/2015 | Platzgummer |
| 2015/0028230 A1 | 1/2015 | Platzgummer |
| 2015/0069260 A1 | 3/2015 | Platzgummer |
| 2015/0243480 A1 | 8/2015 | Yamada |
| 2015/0248993 A1 | 9/2015 | Reiter et al. |
| 2015/0311030 A1 | 10/2015 | Platzgummer et al. |
| 2015/0311031 A1 | 10/2015 | Platzgummer et al. |
| 2015/0347660 A1 | 12/2015 | Platzgummer et al. |
| 2016/0012170 A1 | 1/2016 | Platzgummer |
| 2016/0013019 A1 | 1/2016 | Platzgummer |
| 2016/0071684 A1 | 3/2016 | Platzgummer et al. |
| 2016/0276131 A1 | 9/2016 | Platzgummer |
| 2016/0276132 A1 | 9/2016 | Platzgummer et al. |
| 2016/0284509 A1 | 9/2016 | Matsumoto |
| 2016/0284513 A1* | 9/2016 | Inoue .......... H01J 37/3026 |
| 2016/0336147 A1 | 11/2016 | Platzgummer |
| 2016/0349626 A1 | 12/2016 | Matsumoto |
| 2017/0032926 A1 | 2/2017 | Miyamoto |
| 2017/0154750 A1 | 6/2017 | Sato |
| 2017/0357153 A1 | 12/2017 | Platzgummer |
| 2018/0019094 A1 | 1/2018 | Iwata |
| 2018/0218879 A1 | 8/2018 | Platzgummer et al. |
| 2019/0066976 A1 | 2/2019 | Platzgummer et al. |
| 2019/0088448 A1 | 3/2019 | Platzgummer et al. |
| 2019/0214226 A1 | 7/2019 | Platzgummer et al. |
| 2019/0237288 A1 | 8/2019 | Platzgummer et al. |
| 2019/0304749 A1* | 10/2019 | Yoshikawa .......... H01J 37/304 |

FOREIGN PATENT DOCUMENTS

| | | | |
|---|---|---|---|
| EP | 0928012 A2 | 7/1999 | |
| EP | 1033741 A2 | 9/2000 | |
| EP | 1993118 A2 | 11/2008 | |
| EP | 2019415 A1 | 1/2009 | |
| EP | 2187427 A2 | 5/2010 | |
| EP | 2190003 A2 | 5/2010 | |
| EP | 2214194 A1 | 8/2010 | |
| EP | 2312609 A1 | 4/2011 | |
| EP | 2317535 A2 | 5/2011 | |
| EP | 2363875 A1 | 9/2011 | |
| EP | 2950325 A1 | 12/2015 | |
| EP | 2993684 A1 | 3/2016 | |
| EP | 3037878 A1 | 6/2016 | |
| EP | 3070528 A1 | 9/2016 | |
| EP | 3070528 A1 * | 9/2016 | .......... H01J 37/3026 |
| EP | 3460824 A1 | 3/2019 | |
| EP | 3460825 A1 | 3/2019 | |
| GB | 2349737 A | 11/2000 | |
| JP | 08213301 A | 8/1996 | |
| JP | 2006019436 A | 1/2006 | |
| JP | 2006332289 | 12/2006 | |
| JP | 2007172862 A | 7/2007 | |
| JP | 2010098275 A | 4/2010 | |
| WO | 2006084298 A1 | 8/2006 | |
| WO | 2008053140 A1 | 5/2008 | |
| WO | 2009147202 | 12/2009 | |
| WO | 2012172913 A1 | 12/2012 | |

OTHER PUBLICATIONS

European Search Report for Application 15164770, report dated Sep. 18, 2015; 2 pgs.

European Search Report for Application 15164772, report dated Sep. 11, 2015, 2 pgs.

European Search Report for Application 15169632, report dated Oct. 20, 2015, 3 pgs.

European Search Report for Application 15171348, report dated Oct. 30, 2015, 2 pgs.

European Search Report for EP 14176645, dated Dec 1, 2014, 1 pg.

European Search Report for EP Application No. 16174185, Search Completed Dec. 6, 2016, 2 pgs.

European Search Report for European Application 10450070.7 dated May 7, 2012, 13 pgs.

European Search Report for European Application No. 16160622, Search completed Jul. 21, 2016, dated Jul. 21, 2016, 3 pgs.

European Search Report for European Patent Application 16160621, Report Completed Oct. 5, 2016, 3 pgs.

Extended European Search Report for European Application No. 16169216.5, Search completed Sep. 21, 2016, dated Sep. 29, 2016, 12 pgs.

Extended European Search Report for European Application No. 17153506, Search completed Oct. 5, 2017, dated Oct. 16, 2017, 2 pgs.

Extended European Search Report for European Application No. 17187922.4, Search completed Feb. 21, 2018, dated Mar. 6, 2018, 7 pgs.

Extended European Search Report for European Application No. 17191553.1, Search completed Mar. 22, 2018, dated Apr. 9, 2018, 5 pgs.

Extended European Search Report for European Application No. 18150797.1, Search completed Jun. 29, 2018, dated Jul. 9, 2018, 8 pgs.

(56) References Cited

OTHER PUBLICATIONS

Extended European Search Report for European Application No. 18154140.0, Search completed Aug. 16, 2018, dated Sep. 4, 2018, 5 pgs.

"Dither", Wikipedia, Retrieved from https://en.wikipedia.org/w/index.php?title=Dither&oldid=762118152 on Oct. 5, 2017.

"Ordered dithering", Wikipedia, Retrieved from https://en.wikipedia.org/w/index.php?title=Ordered_dithering&oldid=759840417 on Oct. 5, 2017.

Berry et al., "Programmable aperture plate for maskless high-throughput nanolithography", J. Vac. Sci. Technol., Nov./Dec. 1997, vol. B15, No. 6, pp. 2382-2386.

Borodovsky, "EUV, EBDW—ARF Replacement or Extension?", KLA-Tencor Lithography User Forum, Feb. 21, 2010, San Jose, CA, USA, 21 pgs.

Borodovsky, "MPProcessing for MPProcessors", SEMATECH Maskless Lithography and Multibeam Mask Writer Workshop, May 10, 2010, New York, NY, USA, 35 pgs.

Disclosed Anonymously, "Multi-tone rasterization, dual pass scan, data path and cell based vector format", IPCOM000183472D, printed from ip.com PriorArtDatabase, published May 22, 2009, 108 pages.

Hinterberger, "Ion optics with electrostatic lenses", University of Bonn, Germany, 2006, 18 pgs.

Huber et al., "Computing Straight Skeletons and Motorcycle Graphs: Theory and Practice", Thesis, Univ. of Salzburg (Austria) Jun. 2011, 134 pgs.

Kapl et al., "Characterization of CMOS programmable multi-beam blanking arrays as used for programmable multi-beam projection lithography and resistless nanopatterning", Journal of Micromechanics and Microengineering, vol. 21, Mar. 24, 2011, pp. 1-8, doi:10.1088/0960-1317/21/4045038.

Kim et al., "Binary-encounter-dipole model for electron-impact ionization", Physical Review A, Nov. 1994, vol. 50, No. 3, pp. 3954-3967.

Li et al., "Through-Silicon Interposer Technology for Heterogeneous Integration", Future Fab Intl., Issue 45 (Apr. 25, 2013), 6 pgs.

Palfrader et al., "Computing Mitered Offset Curves Based on Straight Skeletons", Computer-Aided Design & Applications, vol. 12, No. 4, Feb. 11, 2015, pp. 414-424, http://dx.doi.org/10.1080/16864360.2014.997637.

Paraskevopoulos et al., "Scalable (24-140 Gbps) optical data link, well adapted for future maskless lithography applications", Proc. SPIE vol. 7271, 72711 I (2009), 11 pgs., doi: 10.1117/12.811495.

Platzgummer et al., "eMET—50keV electron Mask Exposure Tool Development based on proven multi-beam projection technology", Proc. of SPIE, 2010, vol. 7823, pp. 782308-1-782308-12, doi:10.1117/12.864261.

Platzgummer et al., "eMET POC: Realization of a proof-of-concept 50 keV electron multibeam Mask Exposure Tool", Proc. of SPIE, 2011, vol. 8166, pp. 816622-1-816622-7, doi: 10.1117/12.895523.

Shih, "Image processing and mathematical morphology: fundamentals and applications", CRC Press, 2009, pp. 26-32.

Vink et al., "Materials with a high secondary-electron yield for use in plasma displays", Applied Physics Letters, Mar. 25, 2002, vol. 80, No. 12, pp. 2216-2218, DOI: 10.1063/1.464229.

Wheeler et al., "Use of Electron Beams in VLSI", G.E.C.Journal of Science and Technology, General Electric Company. Wembley, Middlesex, GB, vol. 48, No. 2, Jan. 1, 1982 (Jan. 1, 1982), pp. 103-107, XP000820522.

Zhang et al., "Integrated Multi-Electron-Beam Blanker Array for Sub-10-nm Electron Beam Induced Deposition", J. Vac. Sci. Technol., Nov./Dec. 2006, vol. B24, No. 6, pp. 2857-2860, DOI: 10.1116/1.2366677.

European Search Report for Application 08450077.6, report dated Jan. 29, 2010, 2 pgs.

European Search Report for Application 09450211.9-1226; report dated Sep. 14, 2010; 4 pgs.

European Search Report for application 09450212.7; dated Sep. 28, 2010, 9 pgs.

European Search Report for Application 141501197.7, report dated Jun. 6, 2014, 2 pgs.

European Search Report for Application 14165967, report dated Oct. 30, 2014, 2 pgs.

European Search Report for Application 14165970, report dated Jun. 18, 2014, 2 pgs.

European Search Report for Application 14170611, report dated Nov. 4, 2014, 3 pgs.

European Search Report for Application 14176563, report dated Jan. 14, 2015, 2 pgs.

European Search Report for Application 14177851; report dated Oct. 16, 2014; 1 page.

European Search Report for Application 14199183, report dated Jun. 19, 2015, 2 pgs.

European Search Report for Application 15159397.7, report dated Sep. 28, 2015, 7 pgs.

European Search Report for European Application No. 19172550.6, Search completed Dec. 11, 2019, 1 page.

* cited by examiner

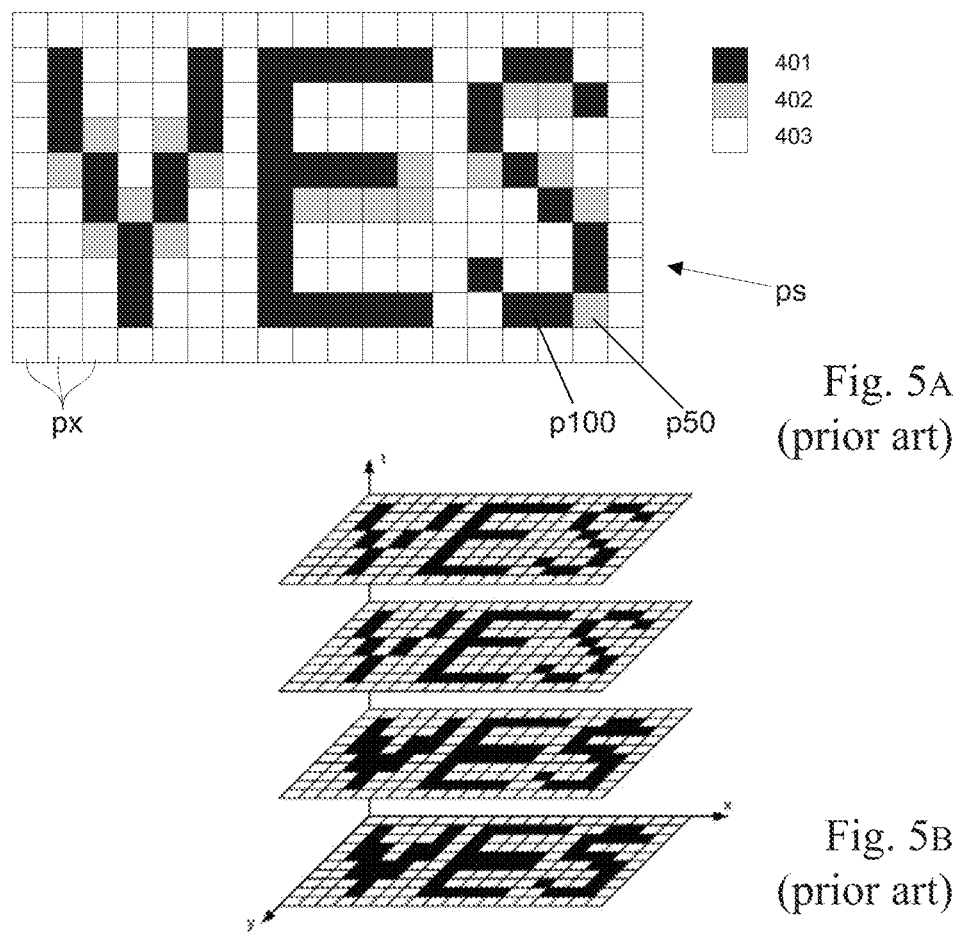
Fig. 5A (prior art)
Fig. 5B (prior art)
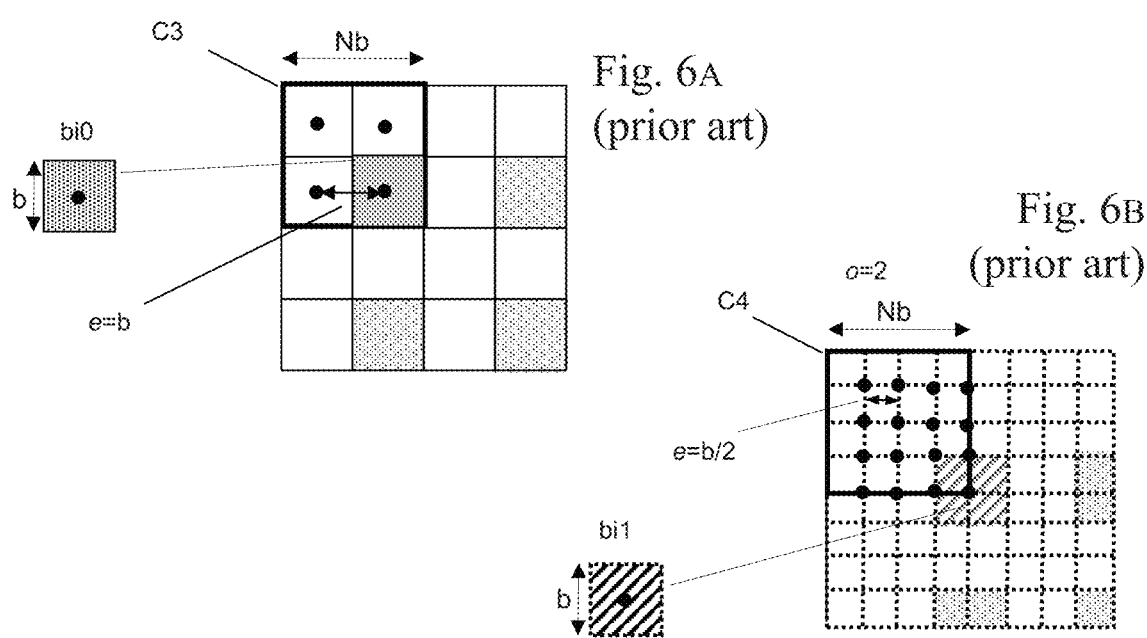
Fig. 6A (prior art)
Fig. 6B (prior art)

Fig. 11A

| | | | |
|---|---|---|---|
| 64.43 | 64.40 | 64.42 | 64.40 |
| 64.31 | 64.43 | 64.46 | 64.37 |
| 64.52 | 64.27 | 64.41 | 64.16 |
| 64.22 | 64.36 | 64.48 | 64.25 |

| | | | |
|---|---|---|---|
| 0.82 | 0.40 | 0.18 | 0.63 |
| 0.04 | 0.09 | 0.11 | 0.69 |
| 0.62 | 0.57 | 0.83 | 0.74 |
| 0.23 | 0.09 | 0.50 | 0.31 |

Fig. 11C

| | | | |
|---|---|---|---|
| 65 | 64 | 64 | 65 |
| 64 | 64 | 64 | 65 |
| 65 | 64 | 65 | 64 |
| 64 | 64 | 64 | 64 |

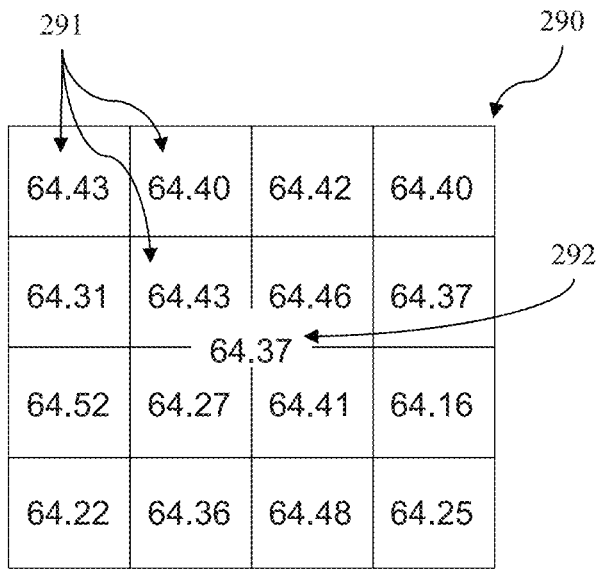
Fig. 12A
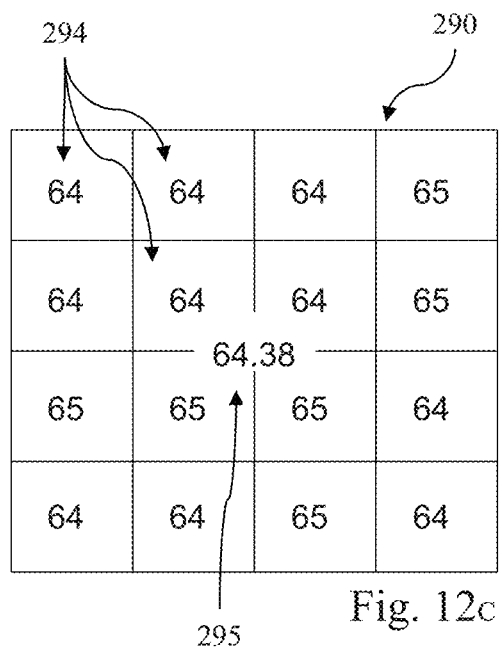
Fig. 12C
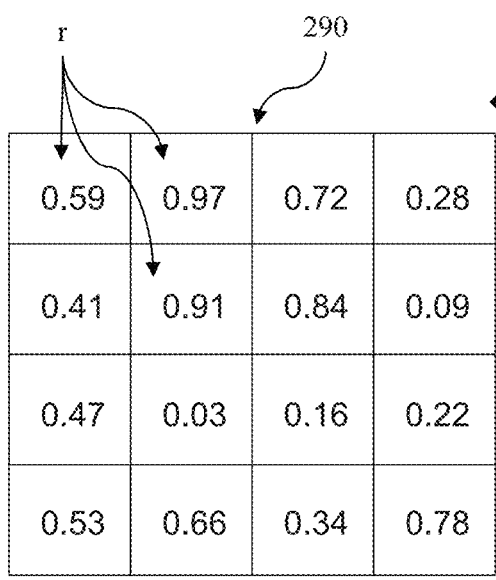
Fig. 12B
Fig. 12

ADAPTING THE DURATION OF EXPOSURE SLOTS IN MULTI-BEAM WRITERS

CROSS-REFERENCED APPLICATIONS

This application claims priority to U.S. Provisional Patent Application No. 62/843,828 filed on May 6, 2019 and European Patent Application No. E.P. 19172550.6 filed on May 3, 2019. The enclosure of which is included herein by reference in its entirety.

FIELD OF THE INVENTION

The present invention generally relates to suitable adapting of the duration of exposure slots during a charged particle lithography process for writing a pattern on a target.

BACKGROUND OF THE INVENTION

Systems and methods for illuminating a pattern on a target using a charged particle beam have been well established. For example, Multi-beam writers (MBWs) as described in U.S. Pat. No. 6,768,125, the disclosure of which is included herein by reference, illustrate instruments for producing charged-particle lithography and methods of producing a multi-beam writing concept that use a programmable aperture plate system (APS) as a pattern definition (PD) device for structuring a particle beam. Additionally, a simplified aperture plate system with apertures arranged in a regular grid as well as a corresponding exposure technique can be illustrated in U.S. Pat. No. 8,222,621, the disclosure of which is included herein by reference.

Furthermore, developments in the field of multi-beam writing have led to a variety of writing strategies that can be used in conjunction with MBWs, including oversampling via overlapping exposure spots ("interlocking grids") illustrated in U.S. Pat. No. 7,276,714, the disclosure of which is included herein by reference. Additionally, a writing strategy known as "trotting mode" as disclosed in U.S. Pat. No. 7,777,201, the disclosure of which is included herein by reference. Such strategies include using one or more beamlets along a mechanical scanning direction to generate the entire set of pixels forming a pattern on a substrate. Some writing methods include using two or more passes of a beam-field across the substrate to generate the exposure as illustrated in U.S. Pat. No. 9,053,906, the disclosure of which is included herein by reference.

Developments and current uses of MBWs can be implemented in a variety of different devices included 50 keV electron writers and can be used with a variety of different beam sizes and patterns. Such methods and instruments however may not take into account small fluctuations in the source current that can ultimately affect the end result of the writing.

BRIEF SUMMARY OF THE INVENTION

Many embodiments are directed a method which comprises adapting the duration of exposure slots according to following steps, starting from a writing process wherein the aperture images have a nominal width, and the aperture images are mutually overlapping on the target so each pixel is exposed through a number of aperture images overlapping at the respective pixel, which—referring to the exposure slots of aperture images overlapping at the pixel as "contributing exposure slots"—results in an exposure of the respective pixel through an effective pixel exposure time which is the sum of durations of contributing exposure slots, the steps being performed respectively in relation to a group of pixels, which group contains all pixels within the image area which are exposed through the same set of contributing exposure slots:

(i) determining a desired duration of the effective pixel exposure time for the pixels (i.e., the pixels in the group of pixels), as a function of the time of exposure of the pixels (i.e., the time when the exposure of the pixels in question is performed),
(ii) determining contributing exposure slots for the pixels,
(iii) calculating durations for the contributing exposure slots thus determined such that the sum of the durations over said contributing exposure slots is an actual effective exposure time which approximates said desired duration of the effective pixel exposure time, wherein the steps are repeated for varying groups of pixels, and in step (iii) the durations are calculated in accordance with a predetermined set of allowed durations, wherein at least one of the durations thus calculated is different from the other durations selected for said set of exposure slots.

It is remarked that some methods of adapting the duration of exposure slots generally does not take into account which desired pattern is to be written on the target, which involves exposing the pixels within the image area with different levels of exposure dose, according to so-called gray values. These different pixel exposures according to (different) gray values are assigned to the pixels in each of the (varying) groups of pixels so as to reproduce the desired pattern. In contrast, the method according to the invention manipulates the duration of exposure slots uniformly for all pixels in a group, i.e., all the pixels within the image area which are exposed through the same set of contributing exposure slots. In other words, the method of adapting the duration of exposure slots may be performed regardless of the exposure of pixels with (spatially) varying exposure doses according to the desired pattern.

Since the duration of exposure slots is controlled by the control circuitry of the blanking electrodes, there may be the limitation that the duration can only be set in discrete steps, e.g., steps of 5 ns (the duration of a single clock cycle). In the latest MBW iterations of the applicant, for instance, the minimal slot duration (which allows maximal throughput) is 400 ns, so where the need may arise to adjust this duration, the available accuracy is only $5/400=1.25\%$, which can lead to jumps in critical dimension ("CD") of around 0.6 nm in a typical MBW. This change of CD due to minimal possible dose granularity can negatively affect critical dimension uniformity ("CDU"), a metric of great importance e.g. in mask manufacturing. The invention circumvents this problem of granularity by using a number of contributing exposure slots, which effectively reduces the granularity by the number of exposure slots involved.

For instance, the set of allowed durations may represent a discrete interval which includes a base value (which may be denoted $T_0$); the values in the set of allowed duration will vary from each other by defined time increments. For instance there may be a uniform time increment ($T_g$) between consecutive values of allowed durations, where preferably the time increment is smaller than the base value by at least one order of magnitude. In most cases, the interval will range between a minimal value and a maximal value, and the width of the interval is smaller than the minimal and maximal values, suitably by one or more orders of magnitude. The interval may be centered around the base value of duration. Suitably, the basic value may correspond to a predetermined nominal exposure slot duration which is uniform to all pixels of the image area. In accordance with an implementation where the clock cycle of the blanking control circuitry is considerably smaller that the duration of an exposure interval/exposure slot, the set of allowed durations will often realize a scale of durations according to a predetermined granularity (i.e., a set of discrete values where subsequent values are distanced from each other at given distance values which correspond to a given size of increment), where the size of increment corresponds to the duration of a clock cycle of a control circuitry of the blanking apertures or an integer multiple thereof. More generally, the set of allowed durations may realize a scale of durations having an increment corresponding to a time increment which is smaller than a typical value from the set of allowed durations by at least one order of magnitude.

In other words, the exposure slots have respective durations which deviate from a uniform nominal slot duration value (the basic value of duration, which represents a typical or standard value of the slot duration) by respective duration corrections, which usually are small compared to the nominal slot duration value. The duration corrections may take any suitable value, but usually are constrained, due to the technical implementation, to take an integer multiple of a minimum time increment, such as the clock cycle of the blanker control circuitry.

One aspect of the invention relates to compensation of varying intensity of the particle beam. In this respect the particle beam may be monitored with respect to its intensity by means of a measuring device in the charged-particle lithography apparatus, producing a value of intensity at the time of exposure of a respective exposure slot; and step (i) may, concerning the determination of a desired duration of the effective pixel exposure time, comprise scaling said desired duration in inversely proportionality to the value of intensity.

In many embodiments the overlap of the aperture images is due to an oversampling scheme, where the positional offset of the aperture images is greater than the size of the aperture images. Thus, the nominal width of aperture images may be greater than the distance between positions of neighboring pixels within said multitude of pixels, by an oversampling factor (o) greater than one. This causes the aperture images to mutually overlap on the target so each pixel is exposed through a number of aperture images overlapping at the respective pixel; the number of aperture images overlapping is, e.g., the square of the oversampling factor (i.e., $o^2$), or may a multiple thereof, in particular an integer multiple thereof.

Concerning the number of exposure slots, in a typical class of embodiments of the invention each exposure interval comprises the same number (g) of consecutive exposure slots, said number being two or more, preferably an integer power of two.

The calculation of the duration of the contributing exposure slots in step (iii) may, in many embodiments, done in that each of the durations, denoted $\bar{\tau}$, is calculated starting from the desired duration of the effective pixel exposure time $\tau$, as integer multiples of a predetermined time increment ($T_g$) added to base value ($T_0$), according to:

$$\tau = T_0 + T_g \left\lfloor \frac{\tau - T_0}{T_g} + q \right\rfloor,$$

where the symbol $\lfloor \ \rfloor$ denotes the usual rounding down operation ("floor", rounding to an integer), and q denotes a set of values across a unit interval, where for each of the durations $\bar{\tau}$ a respective value from the set of values q is used. For instance, q may be a pseudo-random set of numbers across the interval (0, 1). Alternatively, q may be an evenly spaced set of numbers in the unit interval, preferably reordered in a scrambling manner.

The determination of the desired duration of the effective pixel exposure time in step (i) may, advantageously, take place as a function of the time of exposure but substantially irrespective of the position of the pixels. This will simplify the amount of calculations to be performed dramatically, without significant detriment to the effectivity of the compensation effect of the method according to the invention.

The contributing slots in step (ii) may be selected as deemed suitable to provide an effective treatment of the pixel elements and the doses imparted to them through the exposure process. For instance, the contributing exposure slots may be chosen so as to be successive within an exposure interval. Alternatively, they may be chosen in a manner which correspond to different pixel elements which are all exposed through the same aperture image or the same number of aperture images (cf. FIG. 12).

Additional embodiments and features are set forth in part in the description that follows, and in part will become apparent to those skilled in the art upon examination of the specification or may be learned by the practice of the disclosure. A further understanding of the nature and advantages of the present disclosure may be realized by reference to the remaining portions of the specification and the drawings, which forms a part of this disclosure.

BRIEF DESCRIPTION OF THE DRAWINGS

The description will be more fully understood with reference to the following figures, which are presented as exemplary embodiments of the invention and should not be construed as a complete recitation of the scope of the invention, wherein:

FIGS. 5A and 5B illustrated an example of a pixel map of an exemplary pattern to be exposed in accordance with prior art.

FIG. 6A illustrates an arrangement of apertures with M=2, N=2 in accordance with prior art.

FIG. 6B illustrates an example of oversampling of the pixels in a "double grid" arrangement in accordance with prior art.

FIG. 8A: "Double Grid", FIG. 8B: "Quad Grid", and FIG. 8c: "Double-Centered Grid" in accordance with prior art.

FIGS. 11A to 11C illustrate implementations of the slot duration calculation by probabilistically rounding in accordance with embodiments of the invention.

FIGS. 12A to 12 C illustrates implementations of the slot duration calculation using an ordered array of offsets in accordance with embodiments of the invention.

DETAILED DESCRIPTION OF THE INVENTION

Figure 1:
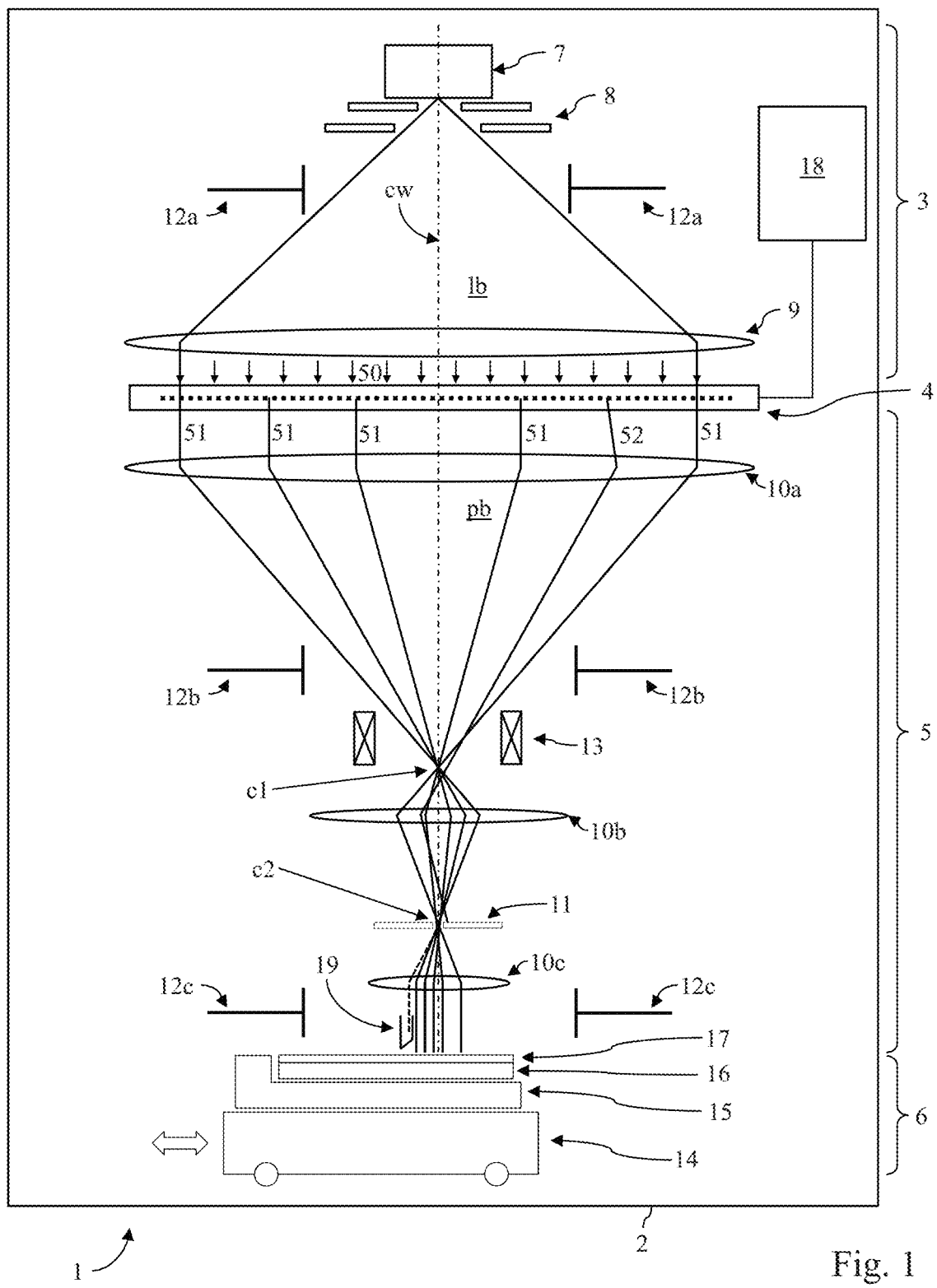
FIG. 1 illustrates a lithographic system in a longitudinal sectional view in accordance with embodiments of the invention.

The detailed discussion of exemplary embodiments of the invention given below discloses the basic concepts and further advantageous developments of the invention. It will be evident to the person skilled in the art to freely combine several or all of the embodiments discussed here as deemed suitable for a specific application of the invention. Throughout this disclosure, terms like "advantageous", "exemplary" or "preferred" indicate elements or dimensions which are particularly suitable (but not essential) to the invention or an embodiment thereof, and may be modified wherever deemed suitable by the skilled person, except where expressly required. It will be appreciated that the invention is not restricted to the exemplary embodiments discussed in the following, which are given for illustrative purpose and merely present suitable implementations of the invention.

Many embodiments are directed to methods for adapting a charged-particle lithography apparatus, during writing a desired pattern, where the duration of exposure slots is adapted to compensate for fluctuations of the particle beam. In the writing process the aperture images are mutually overlapping on the target so each pixel is exposed through a number of aperture images overlapping at the respective pixel, which results in an exposure of the respective pixel through an effective pixel exposure time, i.e., the sum of durations of contributing exposure slots, and the exposure slot durations are adjusted by determining a desired duration of the effective pixel exposure time for the pixels, as a function of the time of exposure of the pixels, and determining contributing exposure slots for the pixels. Additionally many embodiments, include calculating durations for the contributing exposure slots thus determined such that the sum of the durations over said contributing exposure slots is an actual effective exposure time which approximates said desired duration of the effective pixel exposure time. The durations in many embodiments may be calculated in accordance with a predetermined set of allowed durations, wherein at least one of the durations thus calculated is different from the other durations selected for said set of exposure slots.

Some embodiments of the invention relate to a method for exposing a desired pattern on a target in a charged-particle lithography apparatus, using a particle beam of electrically charged particles, which is directed to and illuminates a pattern definition device comprising an aperture array composed of a plurality of blanking apertures through which said particle beam penetrates for writing said desired pattern by exposing a multitude of pixels within an image area on the target; in the pattern definition device each of said plurality of blanking apertures is selectively adjustable to expose, in accordance with said desired pattern, a corresponding aperture image on the target during a respective exposure interval; and during a writing process of said desired pattern, a sequence of exposure intervals is made, wherein in each exposure interval the blanking apertures are imaged onto the target, thus generating a corresponding plurality of aperture images, wherein the position of aperture images is kept fixed relative to the target during an exposure interval, but between exposure intervals the position of aperture images is shifted over the target, thus exposing the multitude of pixels within said image area on the target, each exposure interval comprising an integer number of exposure slots of predetermined duration.

Methods of the above-described type and charged-particle multi-beam processing apparatuses employing such methods are well-known. In particular, the applicant has realized charged-particle multi-beam devices as described in several patents in the name of the applicant with respect to the charged-particle optics, pattern definition (PD) device, and multi-beam writing methods employed therein. For instance, a 50 keV electron multi-beam writer which allows to realize leading-edge complex photomasks for 193 nm immersion lithography, of masks for EUV lithography and of templates (1× masks) for imprint lithography, has been implemented, called eMET (electron Mask Exposure Tool) or MBMW (multi-beam mask writer), for exposing 6" mask blank substrates. Moreover, a multi-beam system also referred to as PML2 (Projection Mask-Less Lithography) was implemented for electron beam direct write (EBDW) applications on Silicon wafer substrates. The multi-beam processing apparatuses of the said kind are hereinafter referred to as multi-beam writer, abbreviated as MBW.

As a typical implementation of a MBW, the applicant has realized a 50 keV electron writer tool, which implemented a total beam size of 20 nm comprising 512×512 (=262,144) programmable beamlets within a beam array field of dimensions 81.92 μm×81.92 μm at the substrate. In this writer tool a typical type of substrate is a 6" mask blank (having an area of 6"×6"=152.4 mm×152.4 mm and thickness of e.g. 1"/4=6.35 mm) covered with an electron beam sensitive resist; furthermore, multi-beam writing is possible on resist-covered 150 mm Si wafers as well.

An MBW suitable for performing the method according to the invention is disclosed in the U.S. Pat. No. 6,768,125. That document describes a charged-particle lithography and processing method which realize a multi-beam writing concept and use a programmable aperture plate system (APS) as a pattern definition (PD) device for structuring a particle beam, which is extracted from a single source of electrically charged particles. The aperture plate system comprises a number of plates stacked on top of the other, among them an aperture array means and a blanking means. These plates are mounted together at defined distances, for instance in a casing. The aperture array means has a plurality of apertures of identical shape defining the shape of beamlets permeating said apertures, wherein the apertures are arranged within a pattern definition field composed of a plurality of staggered lines of apertures, wherein the apertures are spaced apart within said lines by a first integer multiple of the width of an aperture and are offset between neighboring lines by a fraction of said integer multiple width. The blanking means has a plurality of blanking openings arranged in an arrangement corresponding to the apertures of the aperture array means, in particular having corresponding staggered lines of blanking openings, and controls whether beamlets are blocked ("blanked") or transparent to the beam. The teaching of the U.S. Pat. No. 6,768,125 with regard to the architecture and operation of the pattern definition device is herewith included by reference as part of this disclosure. A simplified aperture plate system with apertures arranged in a regular grid and corresponding a exposure technique was disclosed by the applicant in U.S. Pat. No. 8,222,621.

Furthermore, the applicant has disclosed a variety of writing strategies to be used in conjunction with a MBW. These developments include the use oversampling via overlapping exposure spots ("interlocking grids") in U.S. Pat. No. 7,276,714, a novel writing strategy ("trotting mode"), in which one or a few beamlets along the (mechanical) scanning direction are used to generate the entire set of pixels forming a pattern on the substrate in U.S. Pat. No. 7,777,201, and a "multi-pass scanning stripe exposure", where two or more passes of the beam-field across the substrate are utilized for exposure, in U.S. Pat. No. 9,053,906.

In one possible realization of an MBW, the blanking means comprises a blanking chip with an Application Specific Integrated Circuit (ASIC) circuitry controlling which apertures are transparent to the beam and thus form a pattern on the target. The CMOS circuitry, which includes memory and registers attached to the blanking electrodes, is controlled by a clock, e.g. driven by a phase-locked loop ("PLL"), which is operating at a clock rate of e.g. 200 MHz in a typical blanking chip design iteration.

However, many such systems tend to neglect the small fluctuations in the source current and variation of the target dose for different sections of the substrate during exposure. Therefore, many embodiment aim to adapt such systems to compensate for such fluctuations. The present invention proposes to solve the problem of small overall fluctuations by adapting the duration of the individual exposure intervals, or sub-intervals thereof, referred to as slot durations, during exposure of pixels on the target.

Embodiments of a Lithographic Apparatus

An overview of a lithographic apparatus suitable to employ the preferred embodiment of the invention is shown in FIG. 1. In the following, only those details are given as needed to disclose the invention; for the sake of clarity, the components are not shown to size in FIG. 1. The main components of the lithography apparatus 1 are—corresponding to the direction of the lithography beam lb, pb which in this example runs vertically downward in FIG. 1—an illumination system 3, a pattern definition (PD) system 4, a projecting system 5, and a target station 6 with the substrate 16. The whole apparatus 1 is contained in a vacuum housing 2 held at high vacuum to ensure an unimpeded propagation of the beam lb, pb of charged particles along the optical axis cw of the apparatus. The charged-particle optical systems 3, 5 are realized using electrostatic and/or magnetic lenses.

The illumination system 3 comprises, for instance, an electron gun 7, an extraction system 8 as well as a condenser lens system 9. It should, however, be noted that in place of electrons, in general, other electrically charged particles can be used as well. Apart from electrons these can be, for instance, hydrogen ions or heavier ions, charged atom clusters, or charged molecules.

The extraction system 8 accelerates the particles to a defined energy of typically several keV, e.g. 5 keV. By means of a condenser lens system 9, the particles emitted from the source 7 are formed into a broad, substantially telecentric particle beam 50 serving as lithography beam lb. The lithography beam lb then irradiates a PD system 4 which comprises a number of plates with a plurality of openings (also referred to as apertures). The PD system 4 is held at a specific position in the path of the lithography beam lb, which thus irradiates the plurality of apertures and/or openings and is split into a number of beamlets.

Some of the apertures/openings are "switched on" or "open" so as to be transparent to the incident beam in the sense that they allow the portion of the beam that is transmitted through it, i.e. the beamlets 51, to reach the target; the other apertures/openings are "switched off" or "closed", i.e. the corresponding beamlets 52 cannot reach the target, and thus effectively these apertures/openings are non-transparent (opaque) to the beam. Thus, the lithography beam lb is structured into a patterned beam pb, emerging from the PD system 4. The pattern of switched on apertures—the only portions of the PD system 4 which are transparent to the lithography beam lb—is chosen according to the pattern to be exposed on the substrate 16 covered with charged-particle sensitive resist 17. It has to be noted that the "switching on/off" of the apertures/openings is usually realized by a suitable type of deflection means provided in one of the plates of the PD system 4: "Switched off" beamlets 52 are deflected off their path (by sufficient albeit very small angles) so they cannot reach the target but are merely absorbed somewhere in the lithography apparatus, e.g. at an absorbing plate 11.

The pattern as represented by the patterned beam pb is then projected by means of an electro-magneto-optical projection system 5 onto the substrate 16 where the beam forms an image of the "switched-on" apertures and/or openings. The projection system 5 implements a demagnification of, for instance, 200:1 with two crossovers c1 and c2. The substrate 16 is, for instance, a 6" mask blank or a silicon wafer covered with a particle sensitive resist layer 17. The substrate is held by a chuck 15 and positioned by a substrate stage 14 of the target station 6.

The information regarding the pattern to be exposed is supplied to the PD system 4 by the data path realized by means of an electronic pattern information processing system 18. Further details of the data path can be found in U.S. Pat. No. 9,653,263 B2 (section "Datapath"), the disclosure of which is included herein by reference.

In the embodiment shown in FIG. 1, the projection system 5 is composed of a number of consecutive electro-magneto-optical projector stages 10a, 10b, 10c, which preferably include electrostatic and/or magnetic lenses, and possibly other deflection means. These lenses and means are shown in symbolic form only, since their application is well known in the prior art. The projection system 5 employs a demagnifying imaging through crossovers c1, c2. The demagnification factor for both stages is chosen such that an overall demagnification of several hundred results, e.g. 200:1 reduction. A demagnification of this order is in particular suitable with a lithography setup, in order to alleviate problems of miniaturization in the PD device.

In the whole projection system 5, provisions are made to extensively compensate the lenses and or deflection means with respect to chromatic and geometric aberrations. As a means to shift the image laterally as a whole, i.e. along a direction perpendicular to the optical axis cw, deflection means 12a, 12b and 12c are provided in the condenser 3 and projection system 5. The deflection means may be realized as, for instance, a multipole electrode system which is either positioned near the source extraction system 8 or one of the crossovers, as shown in FIG. 1 with the deflection means 12b, or after the final lens 10c of the respective projector, as in the case with the stage deflection means 12c in FIG. 1. In this apparatus, a multipole electrode arrangement is used as deflection means both for shifting the image in relation to the stage motion and for correction of the imaging system in conjunction with the charge-particle optics alignment system. These deflection means 10a, 10b, 10c are not to be confused with the deflection array means of the PD system 4 in conjunction with the stopping plate 11, as the latter are used to switch selected beamlets of the patterned beam pb "on" or "off", whereas the former only deal with the particle beam as a whole. There is also the possibility to rotate the ensemble of programmable beams using a solenoid 13 providing an axial magnetic field.

Figure 2:
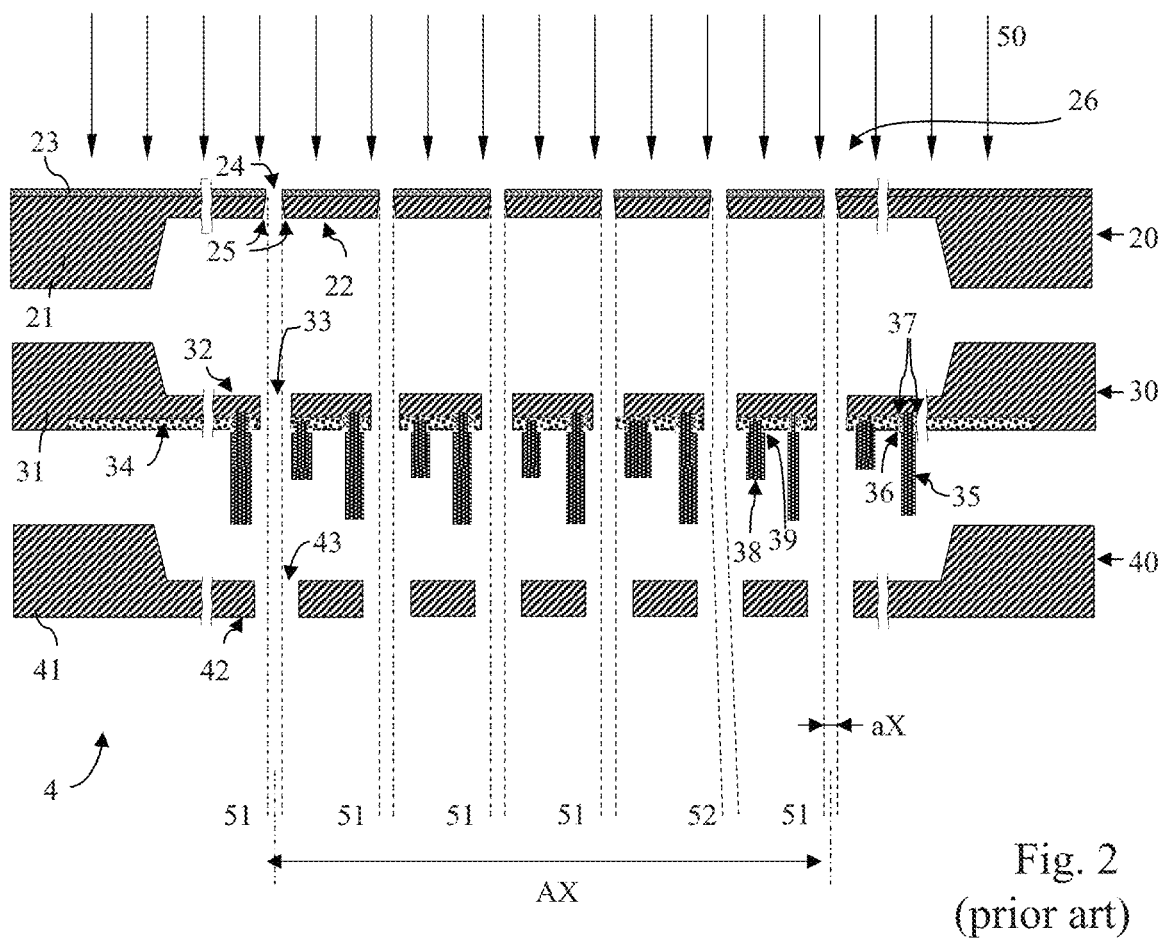
FIG. 2 illustrates a pattern definition system in a longitudinal section in accordance with prior art.

The sectional detail of FIG. 2 illustrates one suitable embodiment of a PD system 4, which comprises three plates stacked in a consecutive configuration: An "Aperture Array Plate" (AAP) 20, a "Deflection Array Plate" (DAP) 30 and a "Field-boundary Array Plate" (FAP) 40. It is worthwhile to note that the term 'plate' refers to an overall shape of the respective device, but does not necessarily indicate that a plate is realized as a single plate component even though the latter is usually the preferred way of implementation; still, in certain embodiments, a 'plate', such as the aperture array plate, may be composed of a number of sub-plates. The plates are preferably arranged parallel to each other, at mutual distances along the Z direction (vertical axis in FIG. 2).

The flat upper surface of AAP 20 forms a defined potential interface to the charged-particle condenser optics/illumination system 3. The AAP may, e.g. be made from a square or rectangular piece of a silicon wafer (approx. 1 mm thickness) 21 with a thinned center part 22. The plate may be covered by an electrically conductive protective layer 23 which will be particularly advantageous when using hydrogen or helium ions (like in U.S. Pat. No. 6,858,118). When using electrons or heavy ions (e.g. argon or xenon), the layer 23 may also be of silicon provided by the surface section of 21 and 22, respectively, so that there is no interface between layer 23 and the bulk parts 21, 22.

The AAP 20 is provided with a plurality of apertures 24 formed by openings traversing the thinned part 22. The apertures 24 are arranged in a predetermined arrangement within an aperture area provided in the thinned part 22, thus forming an aperture array 26. The arrangement of the apertures in the aperture array 26 may be, for instance, a staggered arrangement or a regular rectangular or square array (cf. FIG. 4). In the embodiment shown, the apertures 24 are realized having a straight profile fabricated into the layer 23 and a "retrograde" profile in the bulk layer of the AAP 20 such that the downward outlets 25 of the openings are wider than in the main part of the apertures 24. Both the straight and retrograde profiles can be fabricated with state-of-the-art structuring techniques such as reactive ion etching. The retrograde profile strongly reduces mirror charging effects of the beam passing through the opening.

The DAP 30 is a plate provided with a plurality of openings 33, whose positions correspond to those of the apertures 24 in the AAP 20, and which are provided with electrodes 35, 38 configured for deflecting the individual beamlets passing through the openings 33 selectively from their respective paths. The DAP 30 can, for instance, be fabricated by post-processing a CMOS wafer with an ASIC circuitry. The DAP 30 is, for instance, made from a piece of a CMOS wafer having a square or rectangular shape and comprises a thicker part 31 forming a frame holding a center part 32 which has been thinned (but may be suitably thicker as compared to the thickness of the thinned part 22). The aperture openings 33 in the center part 32 are wider compared to 24 (by approx. 2 μm at each side for instance). CMOS electronics 34 is provided to control the electrodes 35, 38, which are provided by means of MEMS techniques. Adjacent to each opening 33, a "ground" electrode 35 and a deflection electrode 38 are provided. The ground electrodes 35 are electrically interconnected, connected to a common ground potential, and comprise a retrograde part 36 to prevent charging and an isolation section 37 in order to prevent unwanted shortcuts to the CMOS circuitry. The ground electrodes 35 may also be connected to those parts of the CMOS circuitry 34 which are at the same potential as the silicon bulk portions 31 and 32.

The deflection electrodes 38 are configured to be selectively applied an electrostatic potential; when such electrostatic potential is applied to an electrode 38, this will generate an electric field causing a deflection upon the corresponding beamlet, deflecting it off its nominal path. The electrodes 38 as well may have a retrograde section 39 in order to avoid charging. Each of the electrodes 38 is connected at its lower part to a respective contact site within the CMOS circuitry 34.

The height of the ground electrodes 35 is higher than the height of the deflection electrodes 38 in order to suppress cross-talk effects between the beamlets.

The arrangement of a PD system 4 with a DAP 30 shown in FIG. 2 is only one of several possibilities. In a variant (not shown) the ground and deflection electrodes 35, 38 of the DAP may be oriented upstream (facing upward), rather than downstream. Further DAP configurations, e.g. with embedded ground and deflection electrodes, can be devised by the skilled person (see other patents in the name of the applicant, such as U.S. Pat. No. 8,198,601 B2, the disclosure of which is included herein by reference).

The third plate 40 serving as FAP has a flat surface facing to the first lens part of the down-stream demagnifying charged-particle projection optics 5 and thus provides a defined potential interface to the first lens 10a of the projection optics. The thicker part 41 of FAP 40 is a square or rectangular frame made from a part of a silicon wafer, with a thinned center section 42. The FAP 40 is provided with a plurality of openings 43 which correspond to the openings 24, 33 of the AAP 20 and DAP 30 but are wider as compared to the latter.

The PD system 4, and in particular the first plate of it, the AAP 20, is illuminated by a broad charged particle beam 50 (herein, "broad" beam means that the beam is sufficiently wide to cover the entire area of the aperture array formed in the AAP), which is thus divided into many thousands of micrometer-sized beamlets 51 when transmitted through the apertures 24. The beamlets 51 will traverse the DAP and FAP unhindered.

As already mentioned, whenever a deflection electrode 38 is powered through the CMOS electronics, an electric field will be generated between the deflection electrode and the corresponding ground electrode, leading to a small but sufficient deflection of the respective beamlet 52 passing therethrough (FIG. 2). The deflected beamlet can traverse the DAP and FAP unhindered as the openings 33 and 43, respectively, are made sufficiently wide. However, the deflected beamlet 52 is filtered out at the stopping plate 11 of the sub-column (FIG. 1). Thus, only those beamlets which are unaffected by the DAP will reach the substrate.

The reduction factor of the demagnifying charged-particle optics 5 is chosen suitably in view of the dimensions of the beamlets and their mutual distance in the PD device 4 and the desired dimensions of the structures at the target. This will allow for micrometer-sized beamlets at the PD system whereas nanometer-sized beamlets are projected onto the substrate.

The ensemble of (unaffected) beamlets 51 as formed by AAP is projected to the substrate with a predefined reduction factor R of the projection charged-particle optics. Thus, at the substrate a "beam array field" (BAF) is projected having widths BX=AX/R and BY=AY/R, respectively, where AX and AY denote the sizes of the aperture array field along the X and Y directions, respectively. The nominal width of a beamlet at the substrate (i.e. aperture image) is given by bX=aX/R and bY=aY/R, respectively, where aX and aY denote the sizes of the beamlet 51 as measured along the X and Y directions, respectively, at the level of the DAP 30. Thus, the size of a single aperture image formed on the target is bX×bY.

It is worthwhile to note that the individual beamlets 51, 52 depicted in FIG. 2 represent a much larger number of beamlets, typically many thousands, arranged in a two-dimensional X-Y array. The applicant has, for instance, realized multi-beam charged-particle optics with a reduction factor of R=200 for ion as well as electron multi-beam columns with many thousands (e.g., 262,144) programmable beamlets. The applicant has realized such columns with a BAF of approx. 82 μm×82 μm at the substrate. These examples are stated for illustrative purpose, but are not to be construed as limiting examples.

Embodiments of Writing a Pattern

Figure 3:
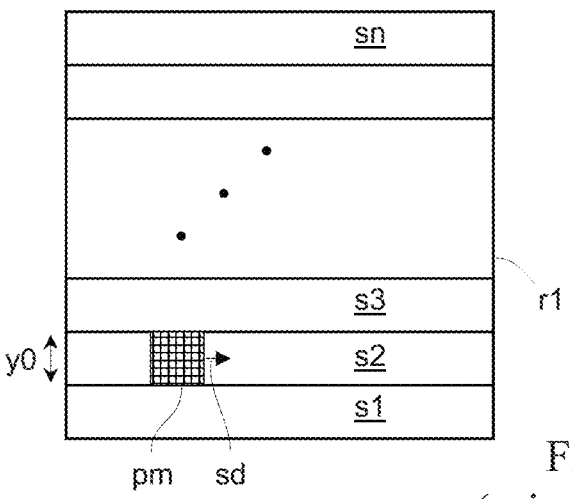
FIG. 3 illustrates the basic writing strategy on the target using stripes in accordance with prior art.

Referring to FIG. 3, a pattern image pm as defined by the PD system 4 is produced on the target 16. The target surface covered with the charged-particle sensitive resist layer 17 will comprise one or more areas r1 to be exposed. Generally, the pattern image pm exposed on the target has a finite size y0 which is usually well smaller than the width of the area r1 which is to be patterned. Therefore, a scanning stripe exposure strategy is utilized, where the target is moved under the incident beam, so as to change the position of the beam on the target perpetually: the beam is effectively scanned over the target surface. It is emphasized that for the purpose of the invention only the relative motion of the pattern image pm on the target is relevant. By virtue of the relative movement the pattern image pm is moved over the area r1 so as to form a sequence of stripes s1, s2, s3, . . . sn (exposure stripes) of width y0. The complete set of stripes covers the total area of the substrate surface. The scanning direction sd may have uniform orientation, or it may have alternate direction of movement from one stripe to the next.

FIG. 5A shows a simple example of an imaged pattern ps with a size of 10×18=180 pixels, where some pixels p100 of the exposure area are exposed to a gray level 401 of 100% and other pixels p50 are exposed 402 to only 50% of the full gray level. The remaining pixels are exposed to a 0% dose 403 (not exposed at all). FIG. 5B illustrates how a 50% level is realized: each pixel is exposed several times, and for a pixel with a gray level between 0 and 100%, the gray level is realized by choosing a corresponding number of the exposures with the pixel activated; the gray level is the fraction of activated exposures over the total number of exposures. In this example, a 50% level is realized by choosing 2 out of 4. Of course, in a realistic application of the invention, the number of pixels of the standard image would be much higher. However, in FIGS. 5A+B the number of pixels is only 180 for the better clarity. Also, in general, much more gray levels will be used within the scale from 0% to 100%.

Thus, the pattern image pm (FIG. 3) is composed of a plurality of pattern pixels px, which are exposed with dose values according to the desired pattern to be exposed. It should be appreciated, however, that only a subset of the pixels px can be exposed simultaneously since only a finite number of apertures is present in the aperture field of the PD system. The pattern of switched-on apertures is chosen according to the pattern to be exposed on the substrate. Thus, in an actual pattern not all pixels are exposed at the full dose, but some pixels will be "switched off" in accordance with the actual pattern; for any pixel (or, equivalently, for every beamlet covering the pixel) the exposure dose can vary from one pixel exposure cycle to the next whether the pixel is "switched on" or "switched off", depending on the pattern to be exposed or structured on the target.

While the substrate 16 is moved continuously, the same image element corresponding to a pattern pixel px on the target may be covered many times by the images of a sequence of apertures. Simultaneously, the pattern in the PD system is shifted, step by step, through the apertures of the PD system. Thus, considering one pixel at some location on the target, if all apertures are switched on when they cover that pixel, this will result in the maximum exposure dose level: a "white" shade corresponding to 100%. In addition to a "white" shade, it is possible to expose a pixel at the target according to a lower dose level (also dubbed 'gray shade') which would interpolate between a the minimal ('black') and maximal ('white') exposure dose levels. A gray shade may, for instance, be realized by switching on only a subset of apertures that may be involved in writing one pixel; for example, 4 out of 16 apertures would give a gray level of 25%. Another approach is reducing the duration of unblanked exposure for the apertures involved. Thus, the exposure duration of one aperture image is controlled by a gray scale code, for example an integer number. The exposed aperture image is the manifestation of one of a given numbers of gray shades that correspond to zero and the maximum exposure duration and dose level. The gray scale usually defines a set of gray values, for instance 0, $1/(n_y-1)$, . . . , $i/(n_y-1)$, . . . , 1 with $n_y$ being the number of gray values and i being an integer ("gray index", $0 \le i \le n_y$). Generally, however, the gray values need not be equidistant and form a non-decreasing sequence between 0 and 1.

Figure 4:
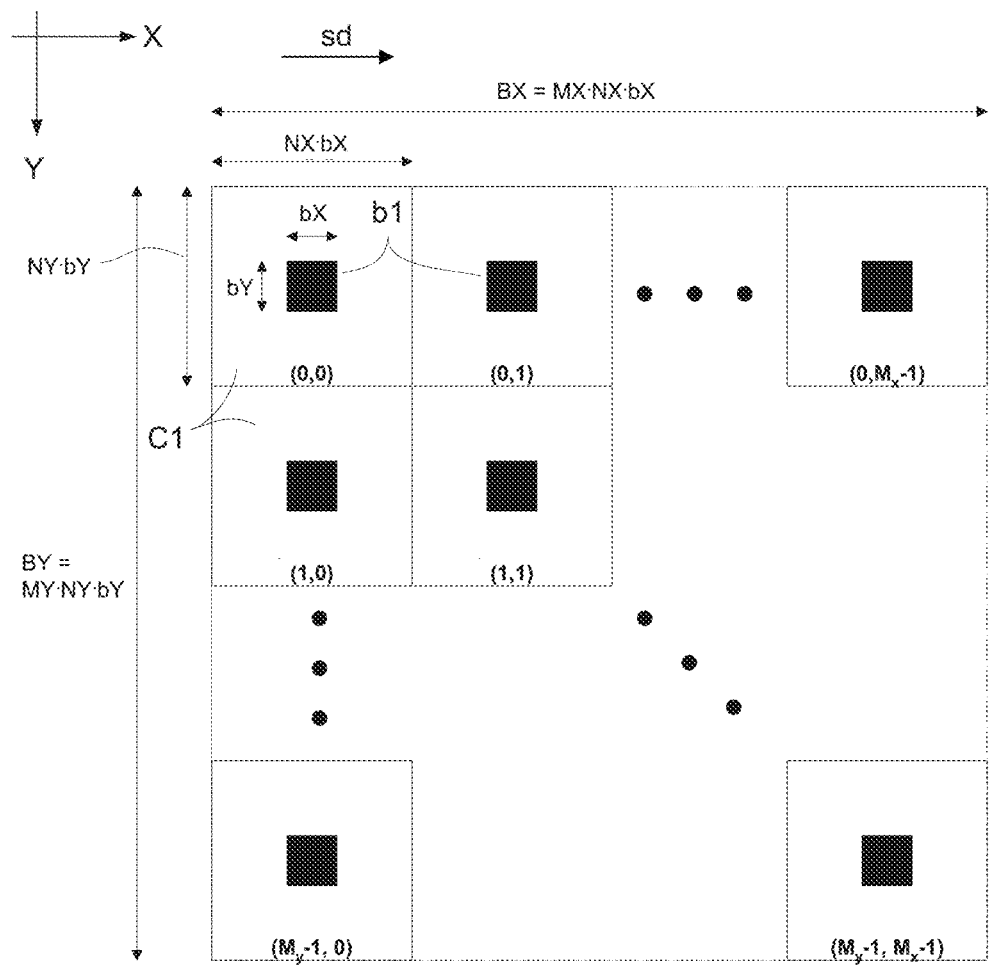
FIG. 4 illustrates an arrangement of apertures as imaged onto the target in accordance with prior art.

FIG. 4 shows a preferred arrangement of apertures in the aperture field of the PD device, according to a basic layout and also illustrates several quantities and abbreviations used in the following. Shown is the arrangement of the aperture images b1 as projected onto the target, shown in dark shades. The main axes X and Y correspond to the direction of advance of the target motion (scanning direction sd) and the perpendicular direction, respectively. Each aperture image has widths bX and bY along the directions X and Y respectively. The apertures are arranged along lines and rows having MX and MY apertures, respectively, with the offset between neighboring apertures in a line and row being NX·bX and NY·bY respectively. As a consequence, to each aperture image belongs a conceptual cell C1 having an area of NX·bX·NY·bY, and the aperture arrangement contains MX·MY cells arranged in a rectangular way. In the following, these cells C1 are referred to as "exposure cells". The complete aperture arrangement, as projected onto the target, has dimensions of BX=MX·NX·bX by BY=MY·NY·bY. In the discussion hereinafter, we will assume a square grid as a special case of a rectangular grid, and set b=bX=bY, M=MX=MY, and N=NX=NY with M being an integer, for all further explanations without any restriction of the generality. Thus, an "exposure cell" has a size of N·b×N·b on the target substrate.

The pitch between two neighboring exposure positions is denoted as e in the following. In general, the distance e can be different from the nominal width b of an aperture image. In the simplest case, b=e, which is illustrated in FIG. 6A for the example of an arrangement of 2×2 exposure cells C3, and one aperture image bi0 covers (the nominal position of) one pixel. In another interesting case, illustrated in FIG. 6B (and in line with the teachings of U.S. Pat. Nos. 8,222,621 and 7,276,714), e may be a fraction b/o of the width b of the aperture image, with o>1 being preferably (but not necessarily) an integer which we also refer to as the oversampling factor. In this case the aperture images, in the course of the various exposures, will spatially overlap, allowing a higher resolution of the placement of the pattern to be developed. It follows that each image of an aperture will, at one time, cover multiple pixels, namely $o^2$ pixels. The entire area of the aperture field as imaged to the target will comprise $(NMo)^2$ pixels. From the point of view of placement of aperture image, this oversampling corresponds to a so-called placement grid which is different (since it is finer in spacing) than what would be necessary to simply cover the target area.

FIG. 6B illustrates one example of an oversampling of o=2 combined with placement grids, referred to as "double-grid": namely, the image of an aperture array with an exposure cell C4 having parameters o=2, N=2. Thus, on each nominal location (small square fields in FIG. 6B) four aperture images bi1 (dashed lines) are printed, which are offset on a regular grid by pitch e in both X and Y directions. While the size of the aperture image still is of the same value b, the pitch e of the placement grid is now b/o=b/2. The offset to the previous nominal location (offset of the placement grid) is also of size b/2. At the same time, the dose and/or the gray shade of each pixel may be adapted (reduced), by choosing suitable gray value for the aperture image that cover the respective pixel. As a result, an area of size a is printed but with an enhanced placement accuracy due to the finer placement grid. Direct comparison of FIG. 6B with FIG. 6A shows that locations of aperture images are just arranged on a placement grid twice (generally, o times) as fine as before, while the aperture images themselves overlap. The exposure cell C4 now contains $(No)^2$ locations (i.e., "pixels") to be addressed during the write process and thus, by a factor of $o^2$, more pixels than before. Correspondingly, the area bi1 with the size of an aperture image b×b is associated with $o^2$=4 pixels in the case of oversampling with o=2 in FIG. 6B (also called "double grid"). Of course, o may take any other integer value as well, in particular 4 ("quad grid", not shown) or 8. The parameter o may also be assigned a non-integer value greater one, such as $2^{1/2}$=1.414 or $2^{3/2}$=2.828, corresponding to the case of the "Double-Centered Grid" shown in U.S. Pat. No. 9,653,263.

It is worthwhile to note that with interlocking grids (o>1) it is possible to increase the number of gray shades by "dithering" while the dose distribution remains homogeneous. The basis for this is that the grey shades on any nominal grid are equal. This means that for the double interlocking grid the number of effective dose levels that can be realized is four times higher than for the non-interlocking grid. Generally speaking any oversampled exposure grid (i.e., o>1) consists of up to $o^2$ nominal grids shifted by distances b/o in X and Y direction. Thus, the step from one dose level to the next can be divided into o sub-steps where the dose level of only one of these o grids is increased; this can be repeated for the other grids until all sub-grids expose the nominal level. As the skilled person will appreciate, the beam shape at the substrate is the convolution of the machine blur and the reduced aperture shape of the aperture plate. It is possible to obtain a homogeneous dose distribution on the substrate by setting the width b to a natural multiple of the exposure grid constant e; in other words, making o=b/e an integer. Otherwise the dose distribution may have minima and maxima with a periodicity of the exposure grid, by virtue of aliasing effects. A high number of gray shades allows better feature placement. Therefore increasing the gray levels is of relevance where the gray shades per pixel position are limited to a certain number.

Figure 7A:
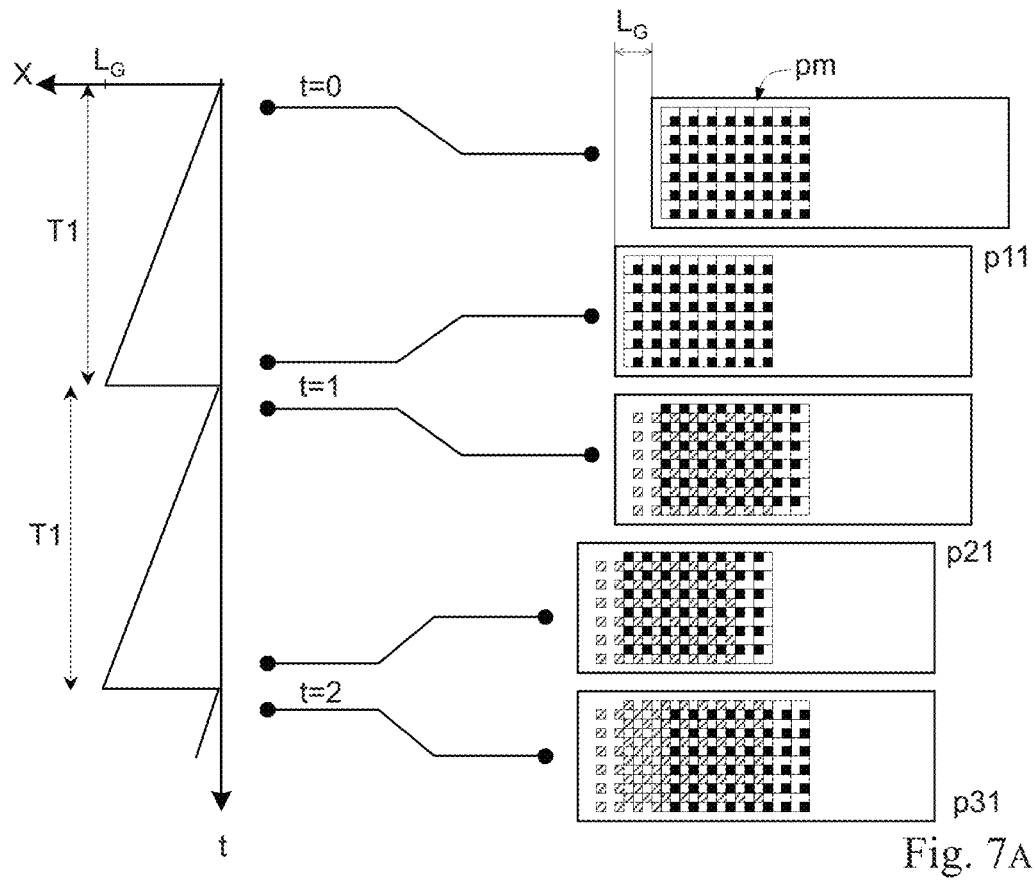
FIG. 7A illustrates the exposure of one stripe in accordance with prior art.

FIG. 7A shows an exposure scheme of the pixels, which is suitable for the scanning stripe exposure, which is preferably used with the invention. Shown is a sequence of frames, with increasing time from top (earlier) to bottom (later). The parameter values in this figure are o=1, N=2; also, a rectangular beam array is assumed with MX=8 and MY=6. The target moves continuously to the left, whereas the beam deflection is controlled with a seesaw function as shown on the left side of the figure. During each time interval of length T1, the beam image stays fixed on a position on the target (corresponding to a position of a "placement grid"). Thus, the beam image pm is shown to go through a placement grid sequence p11, p21, p31. One cycle of placement grids is exposed within a time interval L/v=NMb/v, by virtue of the target motion v. The time T1 for exposure at each placement grid corresponds to a length, which we call "exposure length", given by $L_G$=vT1=L/p=NMb/p, where p denotes the number of exposure positions within a cell (p=No² for a regular oversampled grid).

The beamlets are moved over the distance of $L_G$ during the exposure of one set of image elements together with the target. In other words, all beamlets maintain a fixed position with regard to the surface of the substrate during the time interval T1. After moving the beamlets with the target along distance $L_G$, the beamlets are relocated instantaneously (within a very short time) to start the exposure of the image elements of the next placement grid. After a full cycle through the positions p11 . . . p31 of a placement grid cycle, the sequence starts anew, with an additional longitudinal offset L=bNM parallel to the X direction (scanning direction). At the beginning and at the end of the stripe the exposure method may not produce a contiguous covering, so there may be a margin of length L that is not completely filled.

It is remarked that FIG. 7A neglects the time needed for opening/closing the individual apertures according to the actual pattern. In reality the deflecting devices of the DAP and deflection multipole systems need a certain settling time interval $T_S$, to settle the status of the apertures after repositioning and fading out of transient oscillations. The settling time interval $T_S$ is a (very) small fraction of the pixel exposure cycle T1. Therefore, rather than the entire pixel exposure cycle T1, only a usable time Tu=T1−$T_S$ is used for the exposure of pixels. The time interval Tu is the pixel exposure period within which to ensure that the appropriate dose is passed to the respective pixels.

The usable exposure time Tu is divided into g time slots, corresponding to the number of gray shades possible to address. One value for g would be g=16 (4 bit). The pixel exposure is activated according to the desired gray shade, which is the sum of used time slots within Tu. If the dose applied to one pixel within the time Tu is digitized into g gray levels, it is possible to reload a general blanking cell g times during Tu; each blanking cell in the blanking array receives its individual gray shade during the exposure period Tu.

Figure 7B:
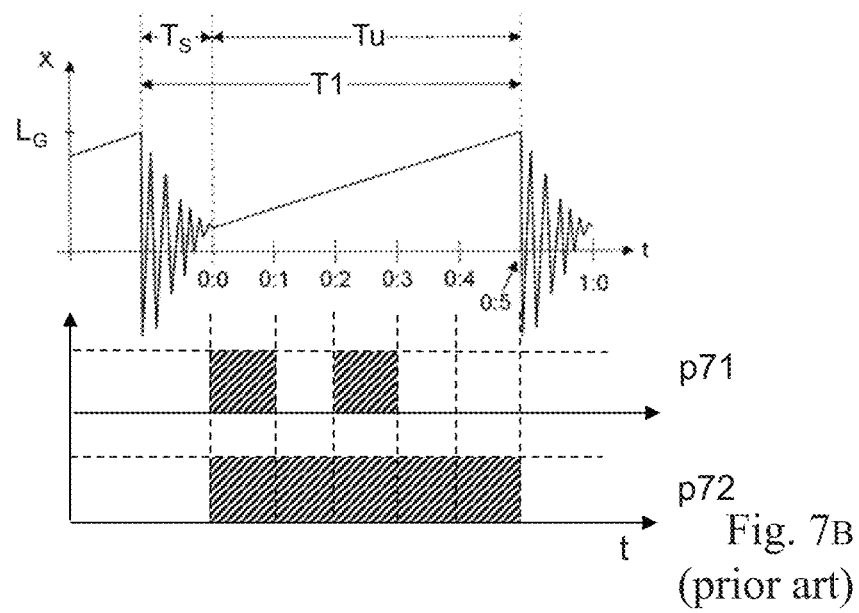
FIG. 7B illustrates the exposure of gray levels in accordance with prior art.

FIG. 7B illustrates the exposure of two pixels with different gray shades in a simplified example with g=5; the relative size of the settling time interval $T_S$ is greatly exaggerated. In accordance with g=5 there are five time slots in each usable time interval Tu. A first pixel p71 is exposed at a gray shade at 100% (i.e., "black"), and a second pixel p72 at a gray shade of 60%. For pixel p72 two time slots of a corresponding blanking electrode generate a gray shaded pixel; in this example, since 60% corresponds to a gray shade with 2 out of 5, and two of them—in arbitrary order—are set to switched-on. On the other hand, for pixel p71 the respective blanking electrode is activated during all five time slots, thus generating a black pixel with the maximum dose that may be deposited during Tu.

Embodiments of Features in Double and Quad Grids

Figure 8A:
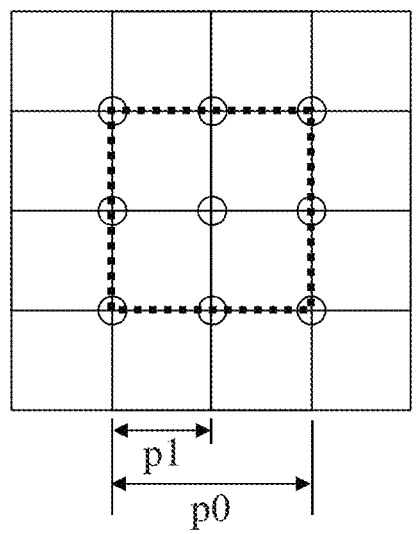
FIGS. 8A to 8C illustrate three different cases of grid placements, namely
Figure 8B:
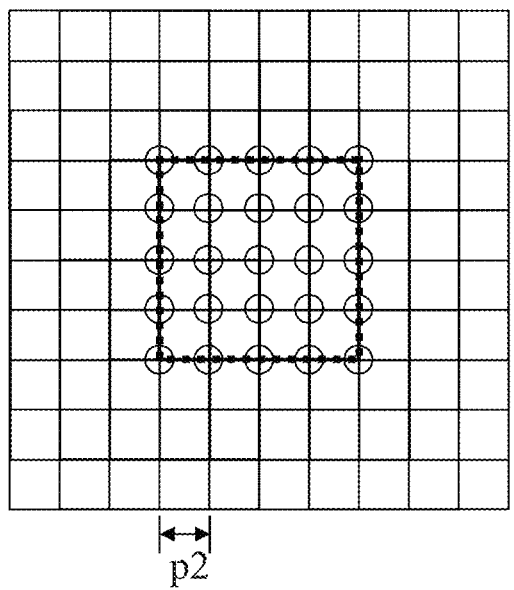
Figure 8C:
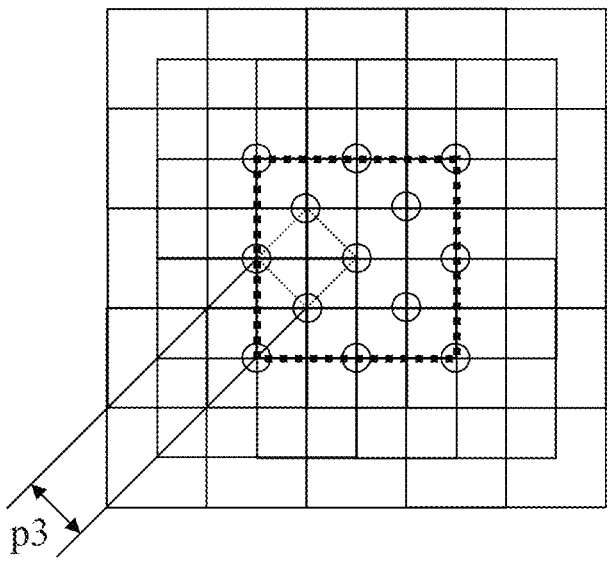

Referring to FIGS. 8A to 8C, each exposure spot p0 corresponding to an aperture image bi0, bi1 (FIG. 6A,B) is exposed with discrete dose levels as will be discussed in more detail below. FIGS. 8A to 8C illustrate various overlap configurations of special interest.

FIG. 8A depicts the "Double Grid" multi-beam exposure as discussed above with FIG. 6B, where the overlap between the exposure spots is half of the beam spot size in the X and Y directions. In this case the physical grid size p1 is half of the linear size of the spots p0.

FIG. 8B illustrates a "Quad Grid" multi-beam exposure, where the overlap between the spots is ¼ of the beam spot size in the X and Y directions. In this case the physical grid size p2 is a quarter of the spot size width.

FIG. 8C depicts another grid layout, where in addition to Double Grid overlapping beam exposures, beam exposures are done in the centers in between. Therefore, the physical grid size p3 is $\frac{1}{2}^{3/2}$ (i.e., $\sqrt{2}/4$) of the linear spot size. This multi-beam exposure mode is called "Double-Centered Grid".

Figure 9A:
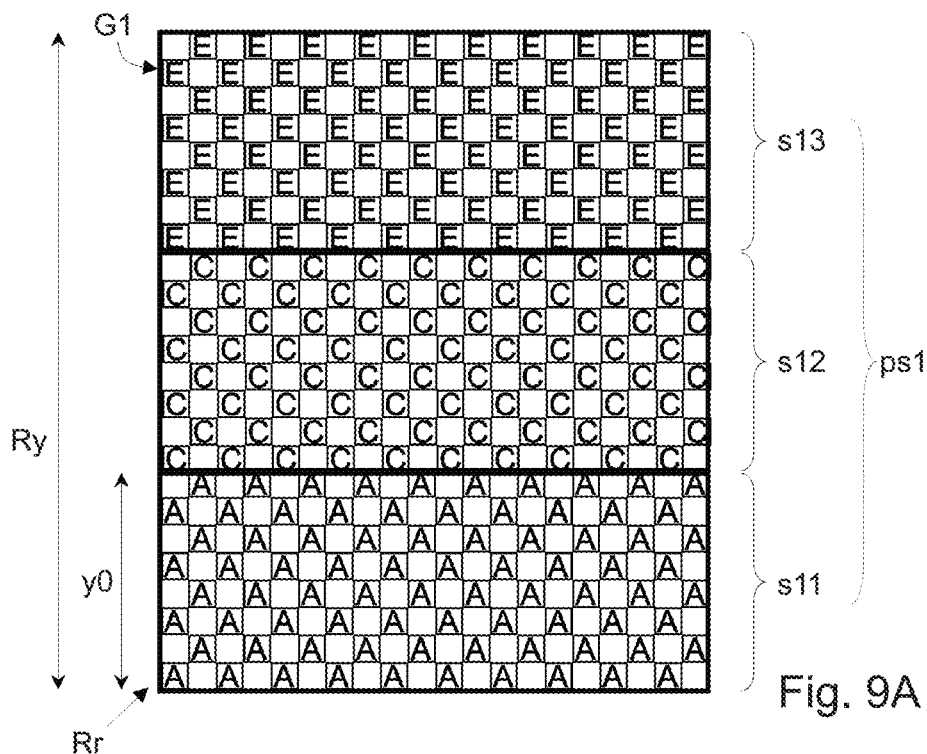
FIGS. 9A and 9B illustrate the overlapping stripe ("multi-pass") strategy for the example of two passes, i.e. the so-called "double-pass" mode in accordance with embodiments of the invention.
Figure 9B:
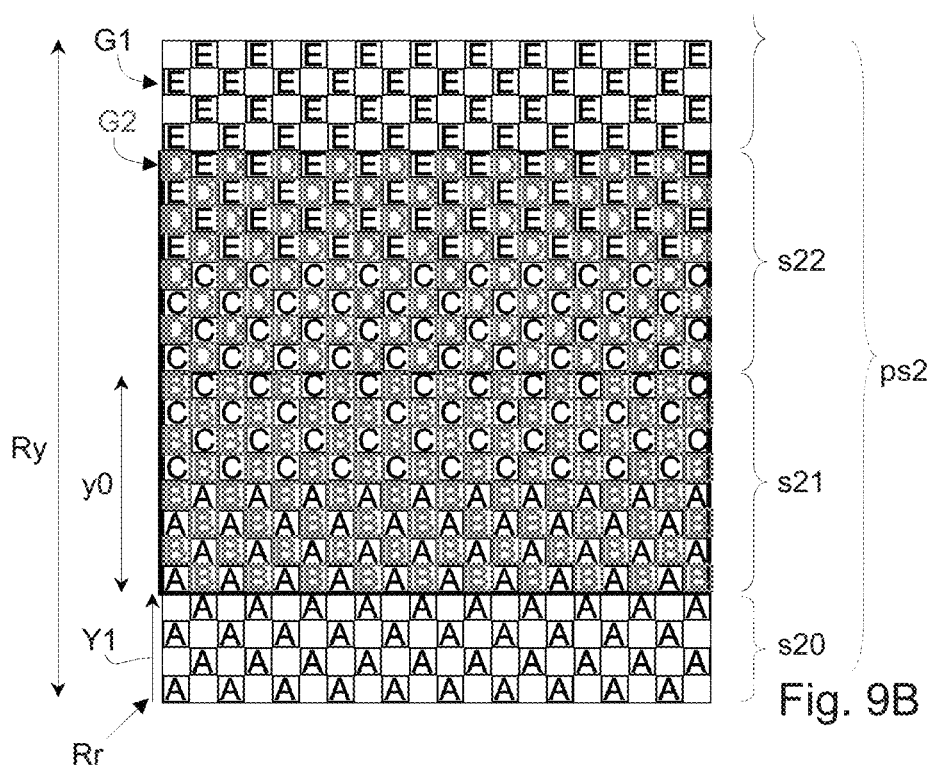

An overlapping stripe ("multi-pass") strategy for error reduction can be illustrated in U.S. Pat. No. 9,053,906. An example of such a strategy ("double-pass") is illustrated in FIGS. 9A and 9B, which show an exemplary sub-area of the target to be exposed in two passes ps1, ps2. In the first pass ps1 the stripes s11, s12, s13 are exposed in consecutive order, thus exposing the pixels belonging to a partial grid G1 (the number of pixels within each of the stripes is reduced in the depiction of FIGS. 9A and 9B for the sake of clarity and will be higher in an a typical embodiment of the invention). In FIG. 9A, letters A, C, E denote the pixels which are exposable through stripes s11, s12, and s13, respectively. The stripes s11 to s13 of one pass are preferably located side-by-side, so as to produce a continuous grid over the area on the target. In this way, the stripes, each having individual width y0, cover the total width Ry of the area Rr to be exposed along the Y direction (i.e., across the scanning direction sd). The stripes s11 to s13 may extend to either side of the area shown, and the first pass ps1 may continue with further stripes (not shown) after the stripe s13 has been imaged. After completion of all stripes of the first pass ps1, the stripes of another pass ps2 are performed, as illustrated in FIG. 9B. The stripes s21, s22 expose pixels formed within the second partial grid G2. FIG. 9B shows two stripes s21, s22, which expose the pixels denoted by letters B and D, respectively. Thus, each pass ps1, ps2 is associated with one of the partial grids G1, G2 of pattern pixels which are exposable during the respective pass. Taken together, the pixels of the grids G1, G2 combine to the complete plurality of pattern pixels in the region which is to be exposed. In other words, the second pass ps2 exposes those pixels which are left out in the first pass ps1, and vice versa. With regard to the Y axis the exposure stripes of different passes are mutually overlapping, preferably in a regular manner wherein the overlapping stripes, for instance of stripes s11 and s21, differ by a transversal offset Y1 along the Y direction (which is the direction across the orientation of the stripes, identical to the scanning direction). For exposing the first half of the stripe s11, and to also cover this part of the total width Ry, an additional 'edge stripe' s20 (not indicated in the pixel pattern) may be performed, in which only the upper half of the pixels are exposed, while the lower half of the pixels are kept switched-off along the entire length of the stripe s20. This approach generalizes in a straightforward manner to more than two passes; for instance, in a "quad-pass" writing strategy, four partial grids written in four passes are combined to form the complete plurality of pattern pixels. Further details concerning the exposure of the pixels through exposure stripes and partial grids are described in U.S. Pat. No. 9,799,487 of the applicant, the disclosure of which is included herein by reference.

Embodiments of Architecture of the Deflection Array Plate

Figure 15A:
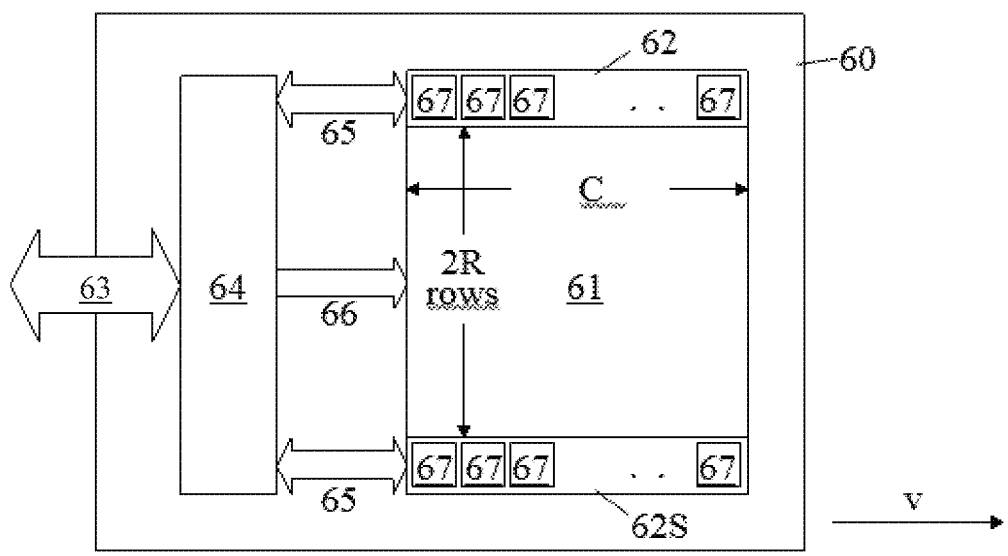
FIG. 15A illustrates a block diagram of an exemplary circuitry layout of a DAP in accordance with prior art.

In the following one suitable implementation of an architecture of the electronics for a DAP 30 is disclosed that allows to establish a writing process as discussed above. An overall block diagram of the electronics 60 of such a DAP is depicted in FIG. 15A. The blankable openings are arranged within an aperture field 61, according to MY=2R rows, each row having MX=C apertures. Thus, the blanker cells can be viewed as C cell columns running perpendicular to the rows (vertical in FIG. 15A; the direction of the rows is horizontal). The blanker cells are addressed in a column-wise fashion using two APS memory arrays 62N, 62S (N and S standing here for 'north' and 'south', respectively), which for instance are dual ported static RAM blocks allowing a high bit density.

The memories are accessible from the external interface 63 of the DAP electronics 60 in read and write mode. A control logic 64 interprets commands and data passed to it via the external interface 63 and accordingly performs addressing 65 of the memory arrays 62N, 62S and provides the control signals 66 (clock, enable etc.) for the blanker cells within the aperture field 61. The north RAM data supplies the data and control signals to the upper R blanker rows and the south RAM is connected to the lower R blanker rows.

In the embodiment shown here, the memory arrays 62N, 62S are composed of a number of memory blocks 67 realized by individual memory units. Each of these blocks 67 is realized as dual ported RAM (DPRAM). Such DPRAMs are standard library elements of ASIC vendor libraries. It will be obvious that in other embodiments, the memory of the DAP electronics 60 may be organized otherwise, for example in two memory banks (corresponding to arrays 62N, 62S) or only one memory, or a number of memory blocks 67 may be realized by respective memory units, depending on the memory size of the memory units.

Figure 15B:
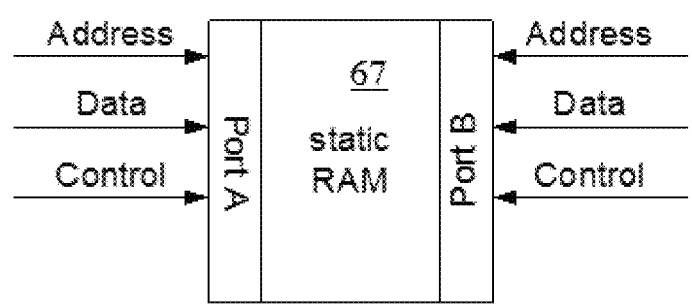
FIG. 15B illustrates a block diagram of one RAM memory in the circuitry of FIG. 15A in accordance with prior art.

Referring to FIG. 15B, the RAM of each memory block 67 is built of static storage elements, which allow a very high storage density within the ASIC. The complete RAM of each RAM block is addressable through two ports, labeled Port A and Port B, each of which is accessible through respective access means comprising an address bus, a data bus and additional control signals, as further explained below. The two ports allow simultaneous access of the information from two different locations. Note that the data width and address width does not necessarily need to be the same on both sides, the memory can—for example—be organized in 8 bits on Port A and as 32 bits on the Port B.

Figure 16:
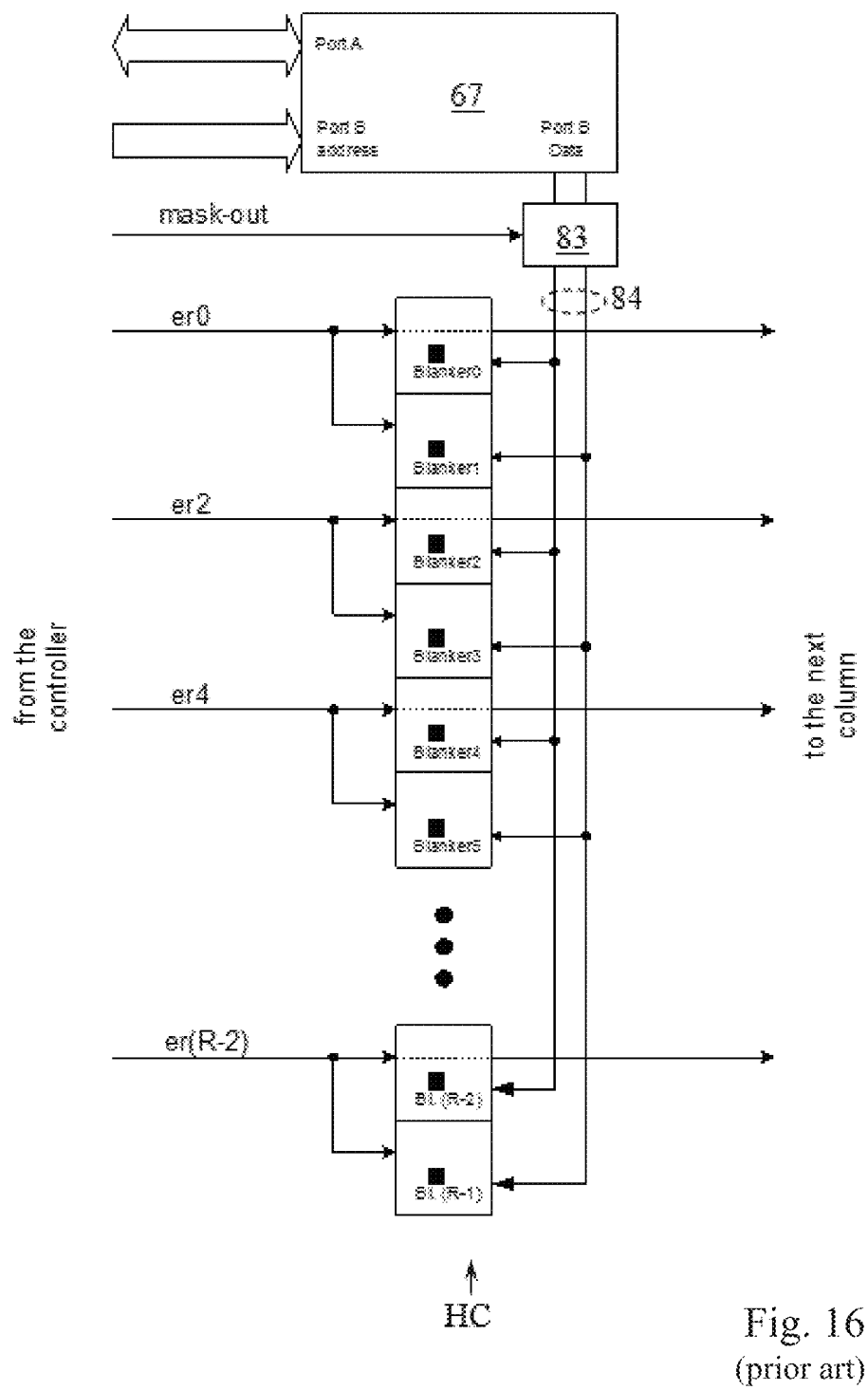
FIG. 16 illustrates is a block diagram of the data supply circuitry of a half-column of apertures in the blanking plate in the circuitry of FIG. 15A in accordance with prior art.

FIG. 16 shows the design of a single half-column HC1, corresponding to the upper (north) half of one blanker column, according to the preferred embodiment of the invention. The blanker cells are denoted Blanker0, . . . , Blanker(R−1) and symbolically depicted as square areas with a small square (the aperture). The lower half of the column is realized symmetrically (mirrored at the horizontal middle axis of the aperture field 61), and further columns simply add to the left and right of the column shown. The blanker information is stored into the DPRAM 67 through Port A, and afterwards is transferred to the individual blanker cells through Port B as control signal data through the control lines 84. Every blanker cell is provided with a 1-bit memory (e.g., a flip flop) to store the current data provided from the DPRAM.

In the layout of FIG. 16 the width bw of the control line data is 2 bits (bw=2), but it can have any other number as well. It is useful to choose the number R in a way that it is an integer multiple of bw. Higher values of bw allow a shorter reloading time of a complete column. The individual blanker cells are enabled to store the information provided from the DPRAM by means of enable-row signals er0, er2, . . . er(R−2) at the correct point of time, each enable-row signal activating a group of bw cells. Only one enable-row signal is active at a time, so the data on the control line 84 is loaded into the one correct blanker cell group; after that, the next blanker cell group is loaded, and so on. For example, if R=128 and bw=8, a column can be reloaded within 128/8=16 clock cycles. Within a 200 MHz design this relates to a time of 80 ns. The common periodicity of the enable-row signals er0, er2, . . . er(R−2) controls the number of clock cycles a given blanker state will be applied. The periodicity has to be greater than the number clock cycles necessary to fully reload the half-columns.

Preferably, sufficient memory is provided to allow an "interleaved" reloading of the blanker cells: The memory of the DPRAM is divided into two address areas A0 and A1 so it is possible to reload one address area A0 via Port A and at the same time load the data stored in the other address area A1 into the blanker cells. In the next pixel exposure cycle the banks are switched, A1 is reloaded via Port A while A0 is loaded into the blanker cells.

For efficient writing algorithms as well as for testing purposes it is useful to provide a static data setting on the control line 84 that allows switching all blanker cells into the blanking mode (switched-off apertures) at the same time. This is done by means of a "mask" block 83, activated by a mask-out signal. If the mask-out signal is set, the data of all blanker cells in the half-row shown will be set to 1, whereas in the normal working mode the mask block 83 is transparent to the data coming from Port B.

Furthermore, it is possible to optionally realize a global blanker-enable signal, which allows switching all apertures of the aperture field simultaneously, for instance as a signal activating all mask-out and enable-row signals of all (half-) columns.

The present layout also allows implementation of "gray levels", i.e., exposure doses between no exposure (minimum dose, 0%) and full exposure (maximum dose at a pixel, 100%; see also U.S. Pat. No. 7,368,738). The gray levels are realized as discrete steps from 0 to g−1, with g being an integer representing the 100% level. The number g of gray levels that can be realized may be realized in the present layout as follows.

Figure 14:
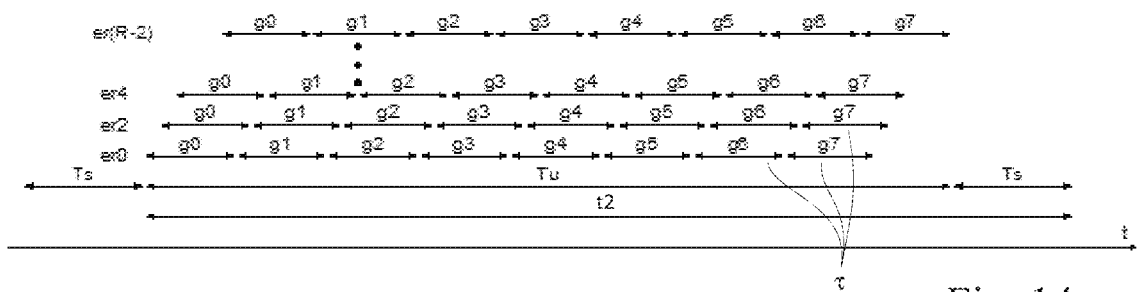
FIG. 14 illustrates a time diagram of the controller operation and loading sequence of pattern data in accordance with prior art.

FIG. 14 shows a timing diagram for the controller operation with 8 gray levels (g=8, three bits), time shown proceeding along the horizontal axis. Conceptually, the time Tu is divided into g time slots, during some of which the pixel is activated according to the desired gray level. For example, with a gray level 5 out of 8, there are eight time slots in each Tu and five of them are set to switched-on. If the dose applied to one pixel within the time Tu is digitized into g gray levels, the blanking cells are reloaded g times within Tu. The blanker cell groups are labeled consecutively by enable-row designators, the gray level components are labeled g0 through g7. The complete loading cycle of the blanker cells is done within one "usable" cycle time Tu. The data is loaded into the blanker cells at g consecutive times (corresponding to time slots) and activated at the start of the respective time slots as shown in FIG. 14; simultaneously, the next set of data for the following exposure cycle is loaded (indicated by the double arrow t2 in FIG. 14). Note that the loading times are staggered between different blanker cell groups as indicated in FIG. 14. In the final part of Tu, each blanker cell group is switched off after the last gray level slot g7 expires; this is conveniently achieved by means of the mask block 83 controlled through the mask-out signal as shown in FIG. 16. The switched-off state continues until the first gray level slot g0 of the next exposure cycle is loaded and activated. The timing diagram shown provides an optimal dose preparation by the APS. To control the duration τ in a given gray-level slot (which corresponds to a "slot duration" of the invention) as well as the maximal exposure time τ·g (and therefore also the minimal and maximal doses), the waiting time after fully reloading the half-columns HC1, . . . , HC(MX), or equivalently, the intervals between consecutive activations of the individual enable-row signals, can be adjusted. Note that the slot duration can only be set in clock cycles, since it is usually not possible to adapt the clock speed during exposure.

More information on the generation of gray-levels, the corresponding circuitry and encoding schemes can be found in U.S. Pat. No. 7,777,201. It is worthwhile to note that the case of the embodiment discussed here, where a slot exposure adaption according to the invention is used to adapt the duration of gray-level slots, is only one application of the invention; it will be evident to the skilled person that other embodiments may implement the invention with other time intervals having the role of exposure slots according to the invention, for instance the entire exposure time Tu, or a sub-interval thereof.

Embodiments of Adapting the Slot Duration

It is well-known in prior art that the maximal target dose D(x,y), for an isolated feature at a given position (x,y) on the substrate, may vary around a nominal value due to various influences such as resist material variability, local layout, where an example for a typical nominal dose value is 100 $\rho C/cm^2$ with a typical variation of ±10%. This variation of the nominal dose may be suitable, for instance, to compensate for fogging due to back-scattered electrons or mask processing effects (such as the etch loading effect). The mentioned effects often act at long ranges, e.g. in the order of several millimeters, and are therefore they are not easily captured by a proximity effect correction (which, for instance, may be implemented through adjusting the number of gray-level slots where the corresponding apertures are opened). Furthermore, in typical implementations of the invention, the current density J emitted by the electron gun 7 (with a typical value of 1 A/cm² at the substrate in current implementations of the MBW) will fluctuate temporally during exposure. In order to maintain the nominal exposure dose uniform, the time-dependent change in gun current may be monitored, e.g. by means of a Faraday cup 19 which is positioned at a suitable position in the extraction system or just before the target (as indicated in FIG. 1), at which position the beam is directed in periodic intervals, preferably during a non-writing time interval between writing cycles. From these quantities, using the duration of an exposure slot (also referred to as slot duration), $\tau=Tu/g$, at a given beam field position (x, y) and time t the value of the maximal target dose (for one pixel element) can be calculated through $\tau \cdot g \cdot o^2 \cdot J(t) = D(x, y)$, where $J(t)$ is the current density of the beam at the position of the target and respective time of exposure. In the event that it is found that there is a mismatch between the (measured) current density $J(t)$ and the maximal target dose $D(x, y)$ as needed for the actual writing process, a correction is needed; however, instead of correcting the current density J, the invention suggests adjusting the slot duration $\tau$ during exposure, and further suggests methods for implementing such adjustments of the slot duration.

The slot duration may be changed for every single exposure interval Tu or every exposure slot, i.e. after every positioning of the aperture field, by adjusting the waiting times between consecutive activations of the enable-row signals er0, er2, . . . er(R−2) in the blanking chip circuitry. However, due to the technical constraints this is only possible in steps of single clock cycles. For instance, in a scenario where the slot duration is adjusted by adding or omitting single clock cycles, assuming a clock cycle time of 5 ns and a minimum slot duration value of 400 ns (as in one of the applicant's implementation of a MBW), a readjustment by single clock cycles will correspond to a dosage error of up to $\pm\frac{1}{2}$ of $(5/400)=\pm0.625\%$, which typically leads to errors in critical dimension ("CD") of around ±0.25 nm. According to one aspect of the present invention a correction of this effect implements suitable adjustments to slot duration values so as to obtain result durations ("actual effective exposure times") which allow to reproduce dose values which are as close as possible to the desired nominal dose values, utilizing the fact that many implementations of MBW apply their beamlets in a redundant manner.

Figure 10:
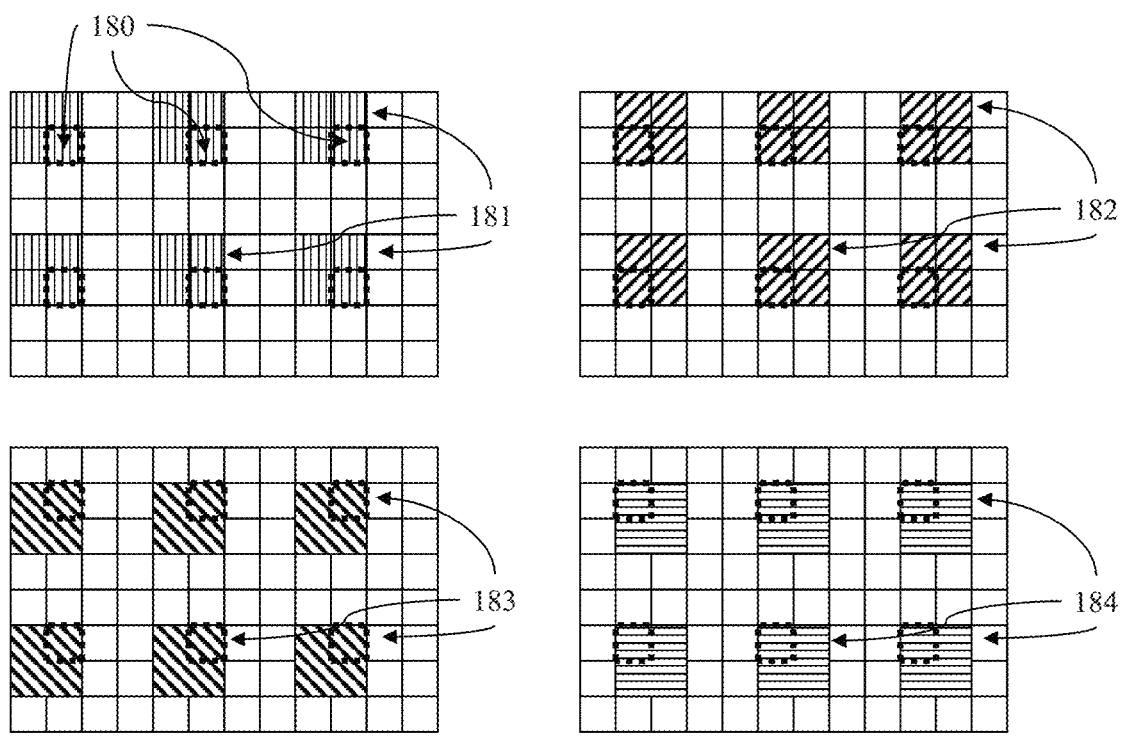
FIG. 10 illustrates an exposure strategy using a "Double-Grid" and (as a simplified example) an aperture array with MX=3, MY=2 in accordance with embodiments of the invention.

In the following an example of the effect is given, based on the exposure strategy illustrated in FIG. 10. In this example, an exposure area is illuminated with an aperture array using a "Double-Grid" arrangement (i.e., o=2), where FIG. 10 shows only a detail of 3×2 exposure cells within a (usually vastly larger) aperture field. FIG. 10 contains four frames which illustrate four (since $o^2=4$) consecutive shots 181, 182, 183, 184 of an exposure process. In this setup, each part of the exposure area ("overlapping area"), such as element 180, is exposed in $o^2=4$ shots (placements of the aperture array), illustrated with different hatchings in the four frames of FIG. 10. It should be noted that FIG. 10 gives a simplified example for better understanding of the invention; in a more general case, a trotting mode as described in U.S. Pat. No. 7,276,714 may be utilized, where the beamlet array can switch "exposure cells" between shots, that is, it may move to an exposure position a number of aperture pitches NX·bX away in writing direction. The slot durations of the shots 181, . . . , 184 determines the minimal and maximal exposure doses that the overlapping areas 180 can receive, regardless of the number of exposure cycles the apertures remain open (i.e. the gray-level of the underlying pixels). In the case that the shots 181, . . . , 184 are assigned slot durations $\tau_1, \ldots, \tau_4$, the element 180 is exposed with an effective slot duration of $\frac{1}{4} (\tau_1+\tau_2+\tau_3+\tau_4)$, i.e. the average of the times of the four shots writing to this element. The worst case-rounding behavior when using "naïve" rounding occurs, for instance, when the nominal slot durations of the shots 181, . . . , 184 are $\tau_1=\tau_2=\tau_3=\tau_4=K+\frac{1}{2}$ clock cycles. In this case, the rounded slot durations are $\bar{\tau}_1=\bar{\tau}_2=\bar{\tau}_3=\bar{\tau}_4=K+1$, with a resulting slot duration of K+1 clock cycles in the overlapping area 180, as compared to the nominal slot duration of $K+\frac{1}{2}$. As mentioned above, this corresponds to a maximal dosage error of about 0.63%, assuming that K is minimal.

In a first implementation of the slot duration calculation, the slot durations of neighboring shots (i.e. placement grids of the beamlet array) are calculated by probabilistical rounding up or down in such a way that their expected value corresponds to the target slot duration. Due to the law of large numbers, if a large interlocking factor o is used, it will be easier to maintain the actual slot duration applied on a given area on the target (i.e., the average slot duration of the beamlets writing said area) close to the expected nominal value. In other words, the value of a slot (expressed in clock cycles) is rounded up with a probability $\rho$, where $\rho$ is the fractional part of the quotient of the nominal slot duration $\tau$ over the duration of a clock cycle; the integer part corresponds to a base value $T_0$ which is, e.g., the next-lower integer multiple of clock cycle duration (i.e., the integer number obtained by dividing the nominal time $\tau$ by the duration of a clock cycle). Using a uniformly distributed random number $q \in (0, 1)$, i.e. $0 \leq q < 1$, this behavior for the approximation slot duration $\bar{\tau}$ for each respective element is obtained by $$\bar{\tau}=\lfloor \tau+q \rfloor$$

where $\lfloor \ \rfloor$ denotes the rounding down operation ("floor") with respect to multiples of the clock cycle duration, and the ensemble of $\bar{\tau}$ values thus obtained will combine to an effective pixel exposure time $T'=\Sigma\bar{\tau}$ (wherein the symbol $\Sigma$ denotes the sum over the number of exposure slots which contribute to the pixel element) which will, divided by the number of exposure slots involved, reproduce the desired average of the slot durations $\tau$.

An example is given in FIG. 11. An exemplary region 190 of the exposure area contains 4·4=16 overlapping beamlets in "Quad-Grid" exposure mode as shown in FIG. 11A. The desired slot durations 191 of the individual shots vary, e.g., between 64.16 and 64.52 clock cycles, which yields an approximated slot duration 192 of 64.37 applied to the overlapping area of the beamlets. If the slot durations for each shot were to be rounded in the standard way, only a single shot would get assigned a slot duration of 65 clock cycles (since only one of the values in region 190 is ≥64.5), giving an average clock cycle time of 64.06, corresponding to an error of 0.47%. According to this embodiment of the invention using probabilistic rounding, the shots are, for instance, assigned approximated slot durations based on 4·4=16 random values q as shown in FIG. 11B, which are used as offset values for producing slot durations 194 of 64.31 clock cycles applied in the overlapping area, shown in FIG. 11C. This resulting time corresponds to an error of only 0.09%, and thus is very close to the desired nominal value.

Another implementation of the slot duration calculation may implement a regular arrangement of offset values. FIG. 20 illustrates one example of this type of implementation, which employs a rounding threshold map (FIG. 12B) containing threshold values r which utilize, or are calculated utilizing, a permutation of the numbers 1, . . . , N². To avoid incidental correlations of threshold map and resulting need to modify slot duration values (changing gray-level times during writing), a random permutation may be preferable. Ideally, N=o (where o denotes the interlocking factor) to ensure optimal rounding behavior of the calculated values when writing a given area on the target. An approximating slot duration $\bar{\tau}$ corresponding to a nominal slot duration $\tau$ (in clock cycles) and index m, n (i.e. the mth shot in y-direction and nth shot in x-direction) is achieved by $$\bar{\tau} = \lfloor \tau - r + 1 \rfloor,$$

with the respective threshold value r (above which the slot duration is rounded up) chosen by $$r = (2\sigma(k)-1)/(2N^2),$$

where k=(m mod N)·N+(n mod N) is a one-dimensional index assigned to the shot m, n; σ(k) denotes a permutation over the set of numbers k=1, . . . , $N^2$. FIG. 12A indicates an exemplary set of (arbitrary) slot durations 291 (in clock cycles), which are assigned to "Quad-Grid" overlapping shots in an exposure area 290; these duration values are rounded with thresholds r (FIG. 12B) generated from a random permutation according to the formula stated above, giving approximated slot durations 294 as shown in FIG. 12C. The effective slot duration 295 generated in the overlapping area of the rounding shot is 64.38, which deviates from the nominal value 292 of 64.37 by only 0.01%.

Embodiments of Adapting Slot Duration with Multi-pass Exposure

In another embodiment, the invention is combined with a "multi-pass" exposure technique as disclosed in U.S. Pat. No. 9,053,906. The inventors discovered, in the course of simulations using a multi-pass technique, that incidental correlations of the values of slot duration of the passes and the thresholds generated from the regular arrangements of offset values described above may occur, and therefore it may be advantageous to adjust the threshold map such that the rounding behavior of the partial grids used in "multi-pass" writing is completely decoupled. To achieve this, all partial grids are assigned mutually different permutations $\sigma_1, \ldots, \sigma_p$ of the set of numbers 1, . . . , $N^2/p$, where p is the number of partial grids, and the threshold values are obtained from the index in accordance with the method described above.

Figure 13:
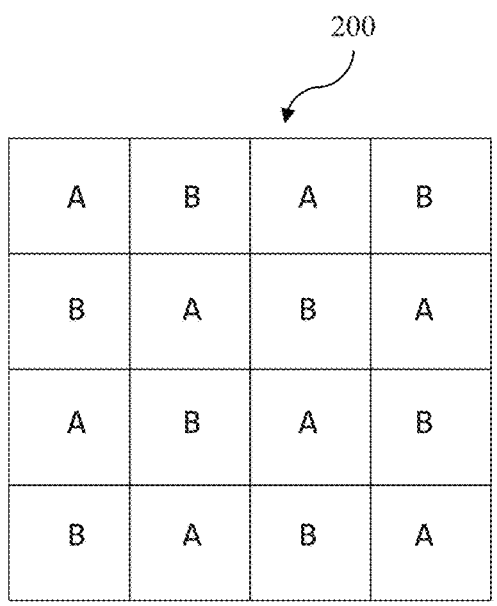
FIG. 13 illustrates another implementation of the slot duration calculation in relation to a double-pass exposure process in accordance with embodiments of the invention.
Figure 13:
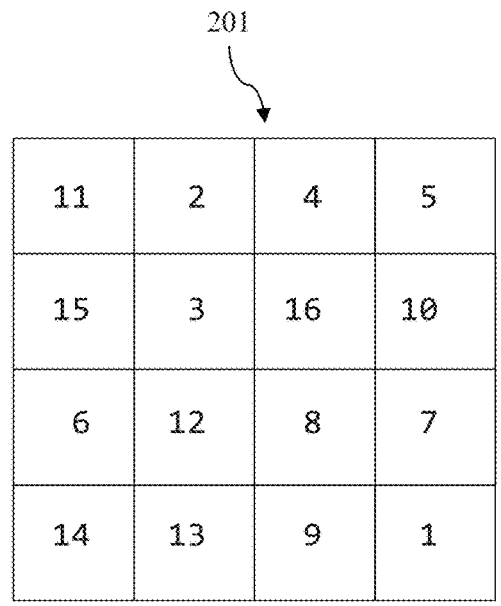
Figure 13:
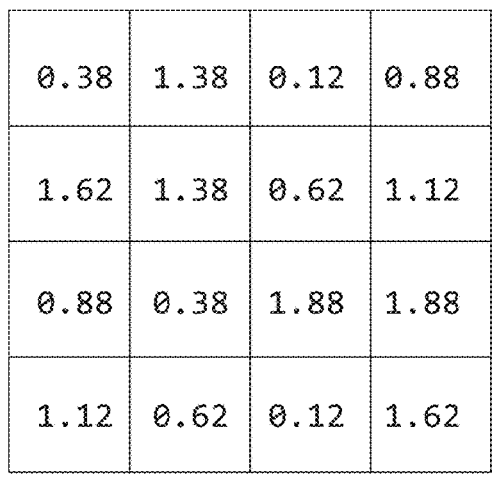
Figure 13:
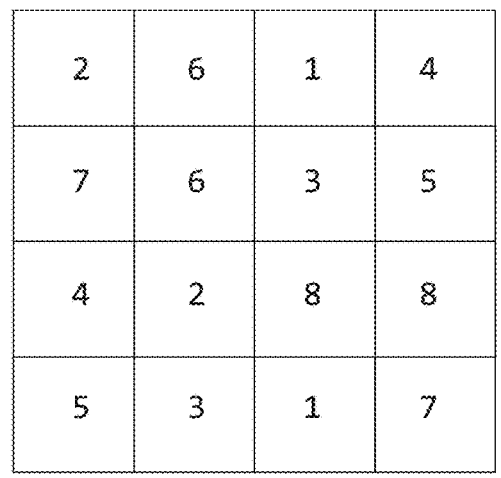

An example for "double-pass" (p=2) and "Quad-Grid" interlocking exposure is given in FIG. 13. The matrix 200 indicates which shots (of a sample of 4×4 neighboring shots) are written in pass A and pass B. If only one permutation is used, the shots are assigned indices from 1 to $N^2=\sigma^2=16$ as shown in 201 (in this example in random order). In contrast, using two different permutations (one for each pass) the partial matrices G1 and G2 (consisting of the matrix elements containing an "A" or "B", respectively, in matrix 200) are assigned indices from 1 to $N^2/p=8$ (again in random order) as shown in frame 202. The thresholds 203 are generated from the indices 202 and utilized for rounding in the same way as explained above with reference to FIG. 12.

Embodiments of Non-uniform Slot Durations within an Exposure Interval

According to another aspect of the invention, it is possible to vary the durations of exposure slots which occur successively within an exposure interval to emulate a desired average slot duration. In the case of the probabilistic rounding method described above can be applied in exactly the same manner but substituting, for the set of slot exposures for neighboring elements, slot exposures in subsequent slot exposures of one element. In the case of the regular approach, the rounding threshold assigned to the l-th exposure slot within an exposure cycle may, for instance, be chosen by $$r=(2\sigma(l)-1)/(2g),$$

where σ is a permutation of the numbers 1, . . . , g.

Note that this approach can also be combined with a spatial variation of exposure slot durations as described above, in a straightforward manner In a more general realization, the base value $T_0$ may be a predetermined value, e.g. a typical value or a standard value of the slot duration, and the individual instance of approximated slot duration $\bar{\tau}$ is calculated as a deviation from the base value expressed in multiples of an increment time, such as the clock cycle duration $T_g$, as $$\tau = T_0 + T_g \left\lfloor \frac{\tau - T_0}{T_g} + q \right\rfloor,$$

where $\lfloor \ \rfloor$ denotes the usual rounding down operation ("floor") to integer values, and the ensemble of $\bar{\tau}$ values thus obtained will reproduce the desired average of the time τ. In other words, the ensemble of values of $\bar{\tau}$ thus obtained will combine to an effective pixel exposure time T'=Σ$\bar{\tau}$ (wherein the symbol Σ denotes the sum over the contributing exposure slots) which will, divided by the number of contributing exposure slots, reproduce the desired average $\bar{\tau}$ of the slot durations τ. This description encompasses the examples given above, with appropriate choices/implementations of the parameters. For instance, implementing the offset values q as random instances taken from an interval of unit width, this will emulate the probabilistic case described above for $T_0=m \cdot T_g$ with m being a suitable non-negative integer.

DOCTRINE OF EQUIVALENTS

As can be inferred from the above discussion, the above-mentioned concepts can be implemented in a variety of arrangements in accordance with embodiments of the invention. Specifically, a method for adapting an MBW to compensate for fluctuations in the particle beam. Achieving such functionality, according to embodiments, involves the implementation of special arrangements/designs between subsystems described above, and their equivalents.

Accordingly, although the present invention has been described in certain specific aspects, many additional modifications and variations would be apparent to those skilled in the art. It is therefore to be understood that the present invention may be practiced otherwise than specifically described. Thus, embodiments of the present invention should be considered in all respects as illustrative and not restrictive.

What is claimed is:

1. Method for exposing a desired pattern on a target in a charged-particle lithography apparatus, using a particle beam of electrically charged particles, which is directed to and illuminates a pattern definition device comprising an aperture array composed of a plurality of blanking apertures through which said particle beam penetrates for writing said desired pattern by exposing a multitude of pixels within an image area on the target, wherein in the pattern definition device each of said plurality of blanking apertures is selectively adjustable to expose, in accordance with said desired pattern, a corresponding aperture image on the target during a respective exposure interval, wherein during a writing process of said desired pattern, a sequence of exposure intervals is made, wherein in each exposure interval the blanking apertures are imaged onto the target, thus generating a corresponding plurality of aperture images, wherein the position of aperture images is kept fixed relative to the target during an exposure interval, but between exposure intervals the position of aperture images is shifted over the target, thus exposing the multitude of pixels within said image area on the target, each exposure interval comprising an integer number of exposure slots of predetermined duration, wherein the aperture images have a nominal width, and the aperture images are mutually overlapping on the target so each pixel is exposed through a number of aperture images overlapping at the respective pixel, which, referring to the exposure slots of aperture images overlapping at the pixel as contributing exposure slots, results in an exposure of the respective pixel through an effective pixel exposure time which is the sum of durations of contributing exposure slots, wherein the method comprises adapting the duration of exposure slots according to following steps, performed respectively in relation to a group of all pixels within the image area which are exposed through the same set of contributing exposure slots:

(i) determining a desired duration of the effective pixel exposure time for the pixels in the group of pixels, as a function of the time when the exposure of the pixels is done,
(ii) determining contributing exposure slots for the pixels,
(iii) calculating durations for the contributing exposure slots thus determined such that the sum of the durations over said contributing exposure slots is an actual effective exposure time which approximates said desired duration of the effective pixel exposure time,
  wherein the steps are repeated for varying groups of pixels, and
  in step (iii) the durations are calculated in accordance with a predetermined set of allowed durations, wherein at least one of the durations thus calculated is different from the other durations selected for said set of exposure slots.

2. The method of claim 1, wherein adapting the durations of exposure slots is performed uniformly for all pixels in a respective group and regardless of the exposure of pixels according to the desired pattern.

3. The method of claim 1, wherein the set of allowed durations represents a discrete scale of durations, said scale including a base value and having an increment corresponding to a time increment which is smaller than the base value by at least one order of magnitude.

4. The method of claim 1, wherein the set of allowed durations realizes a discrete scale of durations wherein the size of increments between consecutive values of duration corresponds to the duration of a clock cycle of a control circuitry of the blanking apertures or an integer multiple thereof.

5. The method of claim 1, wherein the particle beam is monitored with respect to its intensity by means of a measuring device in the charged-particle lithography apparatus, producing a value of intensity at the time of exposure of a respective exposure slot, and in step (i) determining a desired duration of the effective pixel exposure time comprises scaling said desired duration in inversely proportionality to the value of intensity.

6. The method of claim 1, wherein the nominal width of the aperture images is greater than the distance between positions of neighboring pixels within said multitude of pixels, by an oversampling factor greater than one.

7. The method of claim 1, wherein each exposure interval comprises a number of consecutive exposure slots, said number being two or more, preferably an integer power of two.

8. The method of claim 1, wherein in step (iii) each of the durations, denoted $\bar{\tau}$, is calculated starting from the desired duration of the effective pixel exposure time $\tau$, as integer multiples of a predetermined time increment $T_g$ added to a base value $T_0$, according to:

$$\bar{\tau} = T_0 + T_g \left\lfloor \frac{\tau - T_0}{T_g} + q \right\rfloor,$$

where the symbol $\lfloor \ \rfloor$ denotes the usual rounding down operation ("floor"), and q denotes a set of values across a unit interval, where for each of the durations $\bar{\tau}$ a respective value from the set of values q is used.

9. The method of claim 8, wherein q is a pseudo-random set of numbers across the interval (0, 1).

10. The method of claim 8, wherein q is an evenly spaced set of numbers in the unit interval.

11. The method of claim 8, wherein q is an evenly spaced set of numbers in the unit interval, the numbers in the set being reordered in a scrambling manner.

12. The method of claim 1, wherein in step (i) determining a desired duration of the effective pixel exposure time is performed as a function of the time of exposure but substantially irrespective of the position of the pixels.

13. The method of claim 1, wherein in step (ii) contributing exposure slots are chosen which are successive within an exposure interval.

14. The method of claim 1, wherein in step (ii) contributing exposure slots are chosen which correspond to different pixel elements which are all exposed through the same aperture image or the same number of aperture images.

15. The method of claim 3, wherein said base value corresponds to a predetermined nominal exposure slot duration which is uniform to all pixels of the image area.

* * * * *